US012777695B2

(12) United States Patent
Lin et al.

(10) Patent No.: US 12,777,695 B2
(45) Date of Patent: Oct. 27, 2026

(54) SEMICONDUCTOR DEVICE HAVING NANOSHEET TRANSISTOR AND METHODS OF FABRICATION THEREOF

(71) Applicant: TAIWAN SEMICONDUCTOR MANUFACTURING COMPANY, LTD., Hsinchu (TW)

(72) Inventors: Ta-Chun Lin, Hsinchu (TW); Yu-San Chien, Hsinchu (TW); Chun-Sheng Liang, Changhua (TW); Kuo-Hua Pan, Hsinchu (TW); Jhon Jhy Liaw, Hsinchu (TW)

(73) Assignee: TAIWAN SEMICONDUCTOR MANUFACTURING COMPANY, LTD., Hsin-chu (TW)

( * ) Notice: Subject to any disclaimer, the term of this patent is extended or adjusted under 35 U.S.C. 154(b) by 977 days.

(21) Appl. No.: 17/891,348

(22) Filed: Aug. 19, 2022

(65) Prior Publication Data

US 2024/0063293 A1 Feb. 22, 2024

(51) Int. Cl.
*H10D 64/01* (2025.01)
*H10D 30/01* (2025.01)
(Continued)

(52) U.S. Cl.
CPC ......... *H10D 64/017* (2025.01); *H10D 30/014* (2025.01); *H10D 30/43* (2025.01);
(Continued)

(58) Field of Classification Search
CPC .... H10D 64/017; H10D 30/014; H10D 30/43; H10D 30/6735; H10D 30/6757;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Fernando L Toledo
*Assistant Examiner* — Marshall Mu-Nuo Hatfield
(74) *Attorney, Agent, or Firm* — Cooper Legal Group, LLC

(57) ABSTRACT

Embodiments provide a method for forming a semiconductor device structure, includes forming a fin structure having first semiconductor layers and second semiconductor layers alternatingly stacked thereover, forming a sacrificial gate structure over a portion of the fin structure, removing portions of the sacrificial gate structure to expose the first and second semiconductor layers, removing portions of the second semiconductor layers to expose portions of each of the first semiconductor layers. The method includes surrounding the exposed portions of each of the first semiconductor layers with a cladding layer, wherein the cladding layer is formed of a material chemically different from the first semiconductor layers, and the cladding layer has a first atomic percentage of germanium. The method includes performing a thermal treatment so that germanium atoms of the cladding layer are diffused into and reacted with the first semiconductor layer to form an intermixed layer, wherein the intermixed layer has a second atomic percentage of germanium that is less than the first atomic percentage of germanium. The method includes forming a gate electrode layer to surround each of the intermixed layers.

20 Claims, 29 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 84/01*** | (2026.01) |
| ***H10D 84/03*** | (2025.01) |

(52) U.S. Cl.

CPC ....... *H10D 30/6735* (2025.01); *H10D 62/121* (2025.01); *H10D 84/0128* (2025.01); *H10D 84/013* (2025.01); *H10D 84/0158* (2025.01); *H10D 84/0165* (2025.01); *H10D 84/038* (2025.01)

(58) Field of Classification Search

CPC .. H10D 30/797; H10D 62/121; H10D 62/151; H10D 62/822; H10D 62/832; H10D 84/0128; H10D 84/013; H10D 84/0158; H10D 84/0165; H10D 84/038; H01L 2/2251

See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 10,546,787 | B2 | 1/2020 | Bao et al. | |
| 10,867,867 | B2 | 12/2020 | Chiang et al. | |
| 2014/0175543 | A1* | 6/2014 | Glass | H10D 62/235 438/285 |
| 2017/0200656 | A1* | 7/2017 | Li | H01L 21/2255 |
| 2019/0157422 | A1* | 5/2019 | Reboh | H10D 62/121 |
| 2019/0280107 | A1* | 9/2019 | Ando | H10D 64/685 |
| 2020/0135576 | A1 | 4/2020 | Ching et al. | |
| 2020/0373400 | A1 | 11/2020 | Cheng et al. | |
| 2023/0420507 | A1* | 12/2023 | Agrawal | H10D 62/822 |

* cited by examiner

SEMICONDUCTOR DEVICE HAVING NANOSHEET TRANSISTOR AND METHODS OF FABRICATION THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge.

In pursuit of higher device density, higher performance, and lower costs, challenges from both fabrication and design issues have resulted in the development of three-dimensional designs, such as a multi-gate field effect transistor (FET), including a nanosheet FET. In a nanosheet FET, all side surfaces of the channel are surrounded by the gate electrode, which allows for fuller depletion in the channel and results in less short-channel effects and better gate control. As transistor dimensions are continually scaled down, further improvements of the nanosheet FET are needed

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-13A are cross-sectional side views of various stages of manufacturing the semiconductor device structure taken along cross-section A-A of FIG. 6, in accordance with some embodiments.

FIGS. 8B-13B are cross-sectional side views of various stages of manufacturing the semiconductor device structure taken along cross-section B-B of FIG. 6, in accordance with some embodiments.

FIGS. 8C-13C are cross-sectional side views of various stages of manufacturing the semiconductor device structure taken along cross-section C-C of FIG. 6, in accordance with some embodiments.

FIG. 14-1 is an enlarged view of a portion of the semiconductor device structure, in accordance with some embodiments.

DETAILED DESCRIPTION

Figure 1:
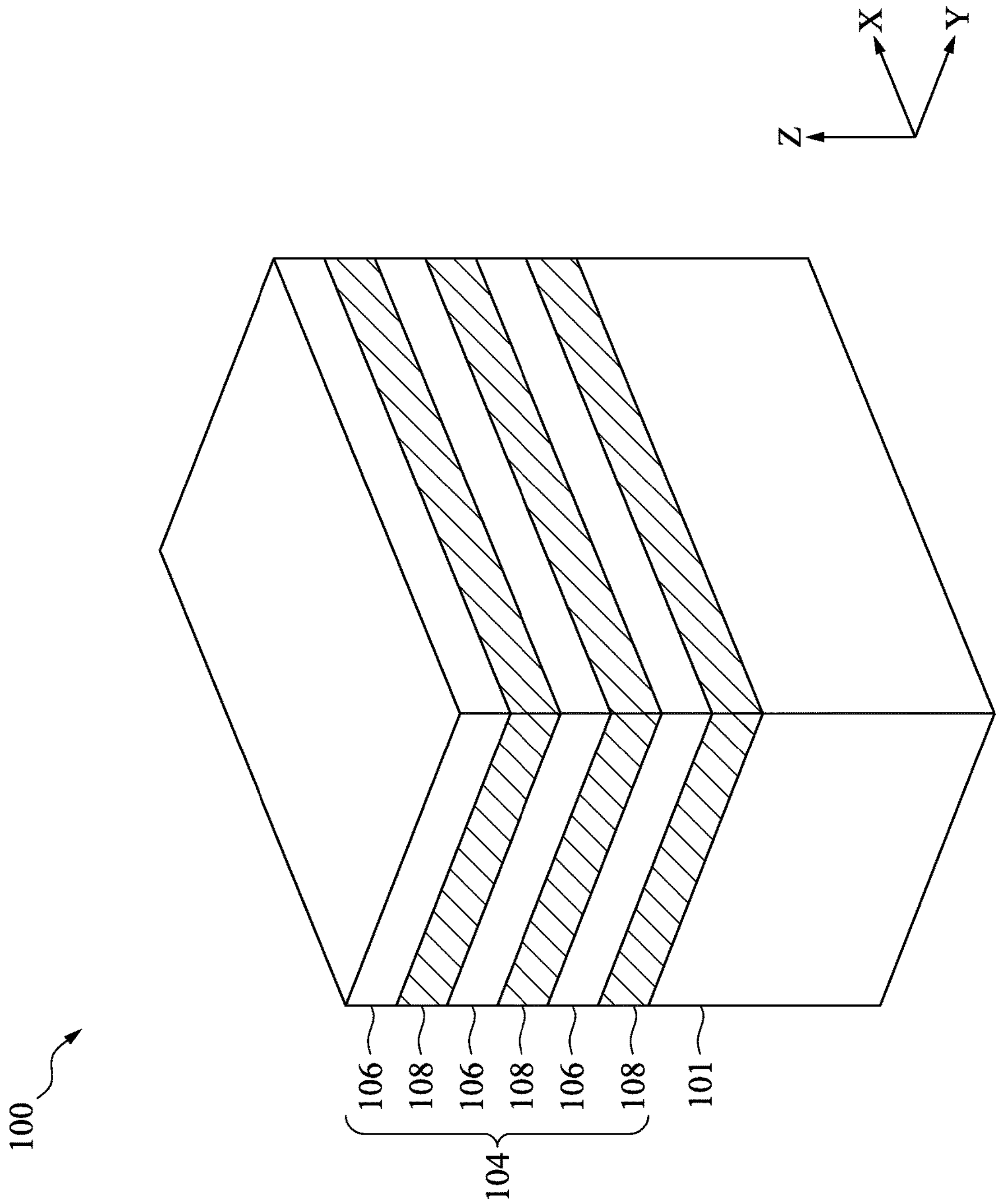
FIGS. 1-6 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-25D show exemplary processes for manufacturing a semiconductor device structure 100 according to embodiments of the present disclosure. It is understood that additional operations can be provided before, during, and after processes shown by FIGS. 1-25D, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100 in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having P-type or N-type conductivity). Depending on circuit design, the dopants may be, for example boron for an P-type field effect transistors (PFET) and phosphorus for a N-type field effect transistors (NFET).

The stack of semiconductor layers 104 includes alternating semiconductor layers made of different materials to facilitate formation of nanosheet channels in a multi-gate device, such as nanosheet channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanosheet or nanostructure channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

Figure 2:
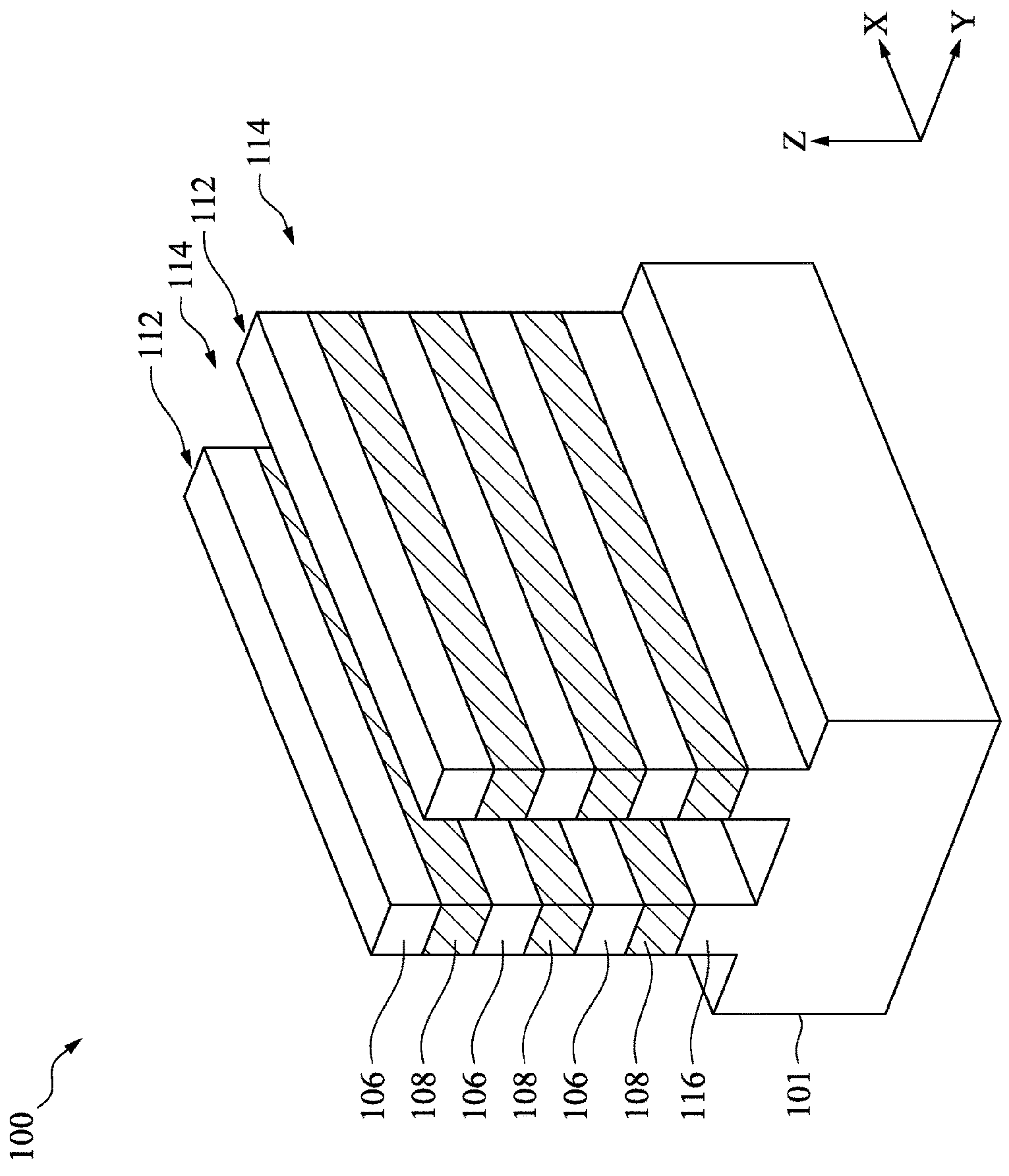

In FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photolithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
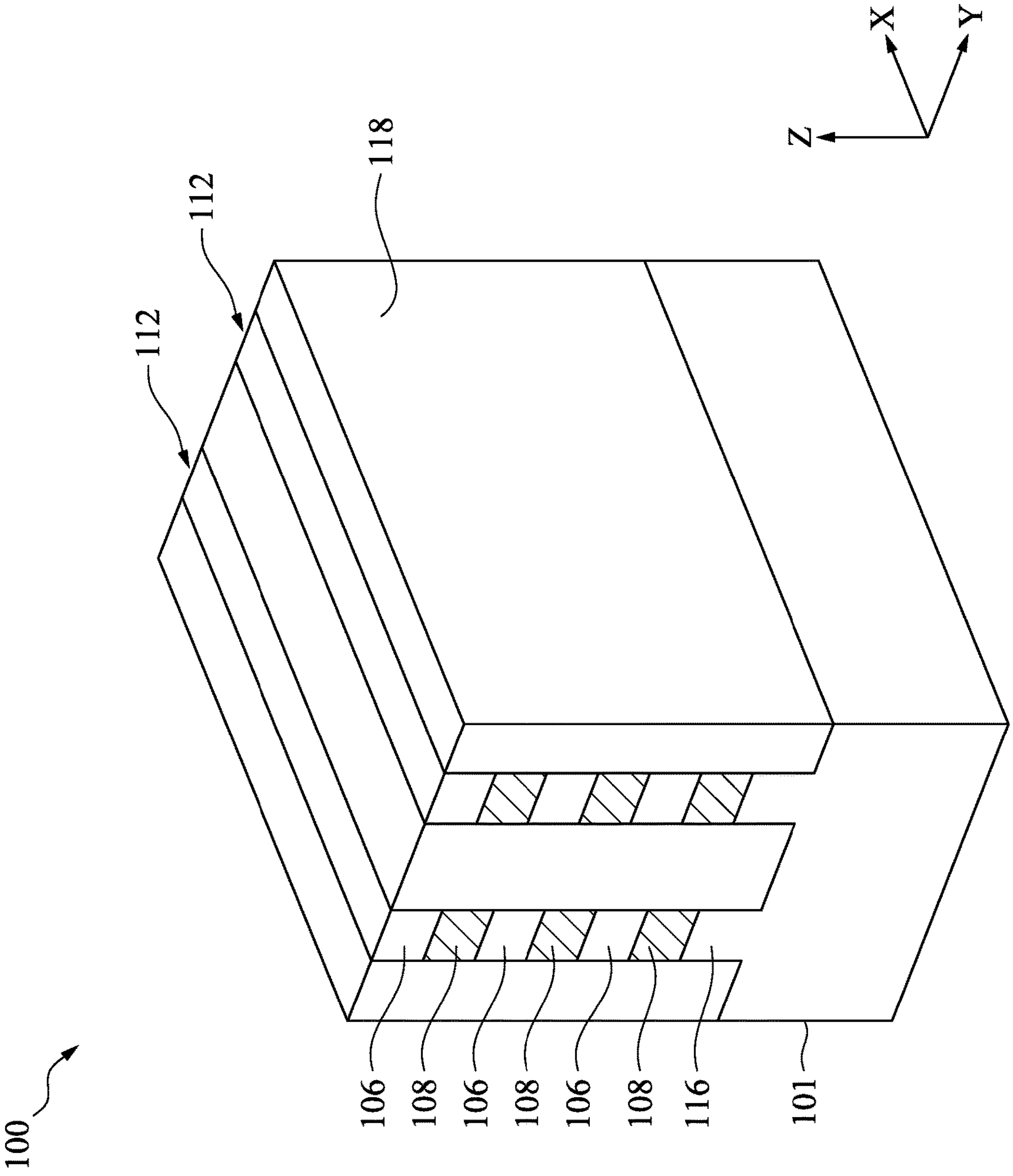

In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
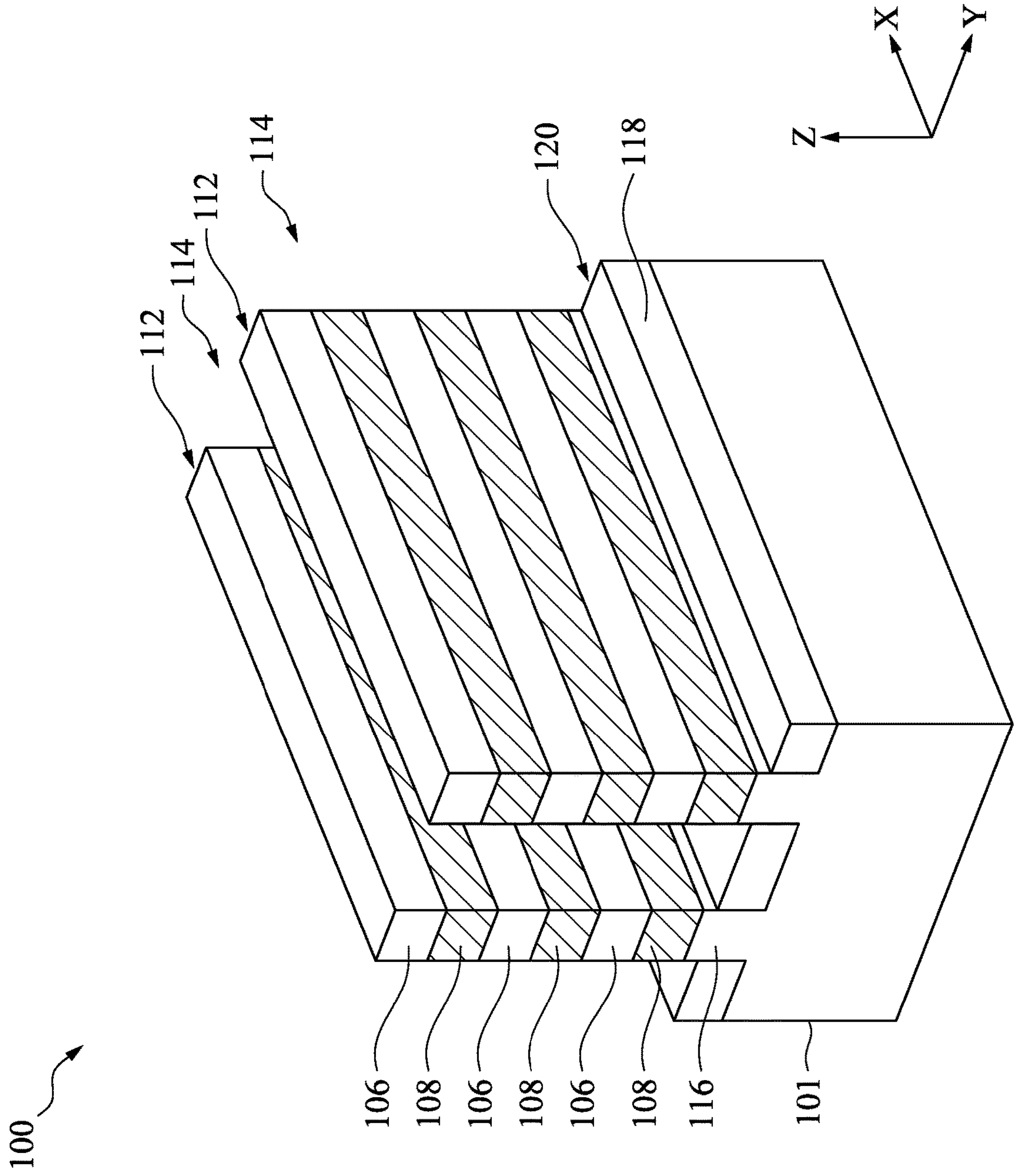

In FIG. 4, the insulating material 118 is recessed to form an isolation region 120. The recess of the insulating material 118 exposes portions of the fin structures 112, such as the stack of semiconductor layers 104. The recess of the insulating material 118 reveals the trenches 114 between the neighboring fin structures 112. The isolation region 120 may be formed using a suitable process, such as a dry etching process, a wet etching process, or a combination thereof. A top surface of the insulating material 118 may be level with or below a surface of the second semiconductor layers 108 in contact with the well portion 116 formed from the substrate 101.

Figure 5:
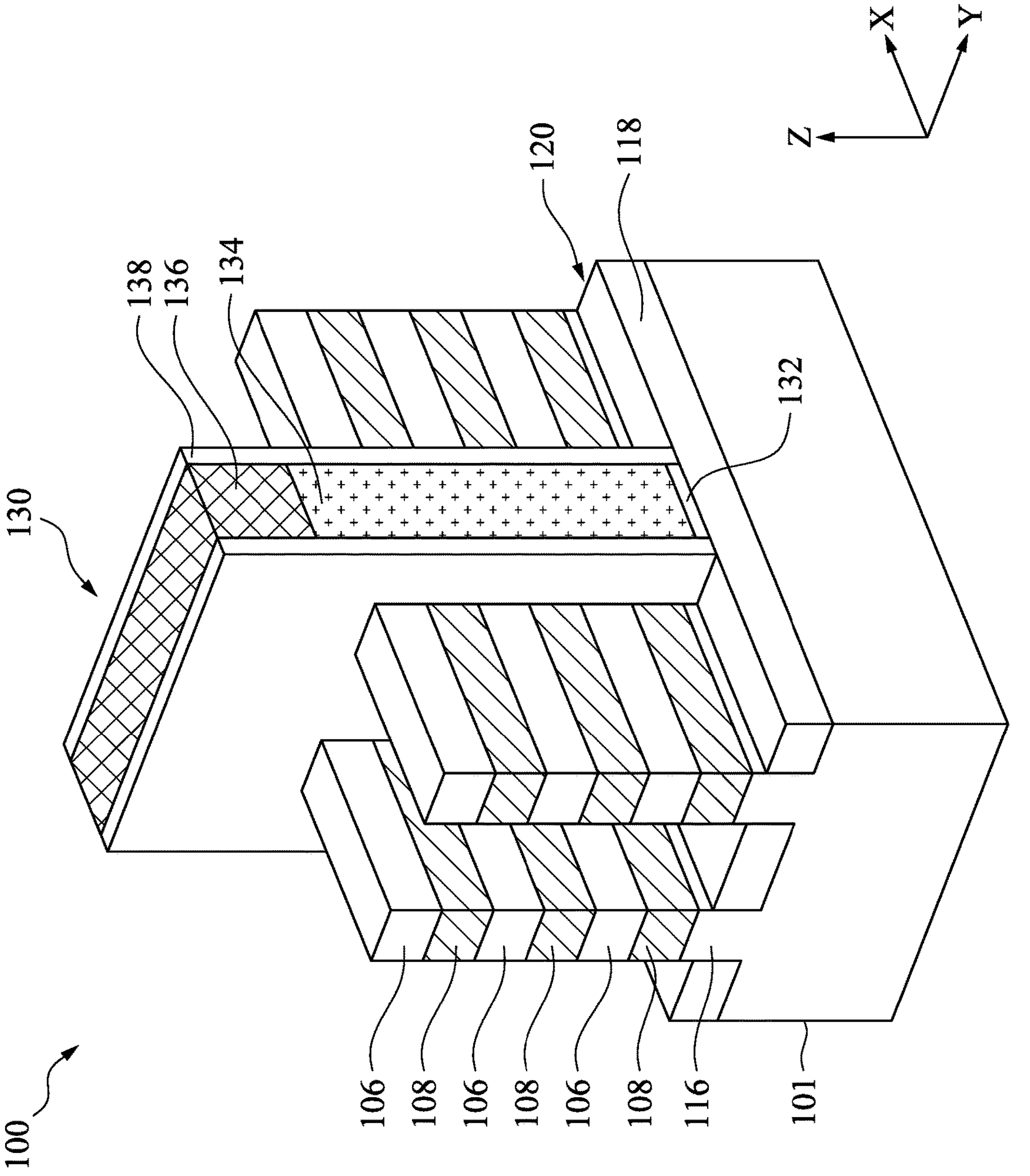

In FIG. 5, one or more sacrificial gate structures 130 are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. Gate spacers 138 are then formed on sidewalls of the sacrificial gate structures 130. The gate spacers 138 may be formed by conformally depositing one or more layers for the gate spacers 138 and anisotropically etching the one or more layers, for example. While one sacrificial gate structure 130 is shown, two or more sacrificial gate structures 130 may be arranged along the X direction in some embodiments.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. In some cases, some S/D regions may be shared between various transistors. For example, various one of the S/D regions may be connected together and implemented as multiple functional transistors. It should be understood that the source region and the drain region can be interchangeably used since the epitaxial features to be formed in these regions are substantially the same.

Figure 6:
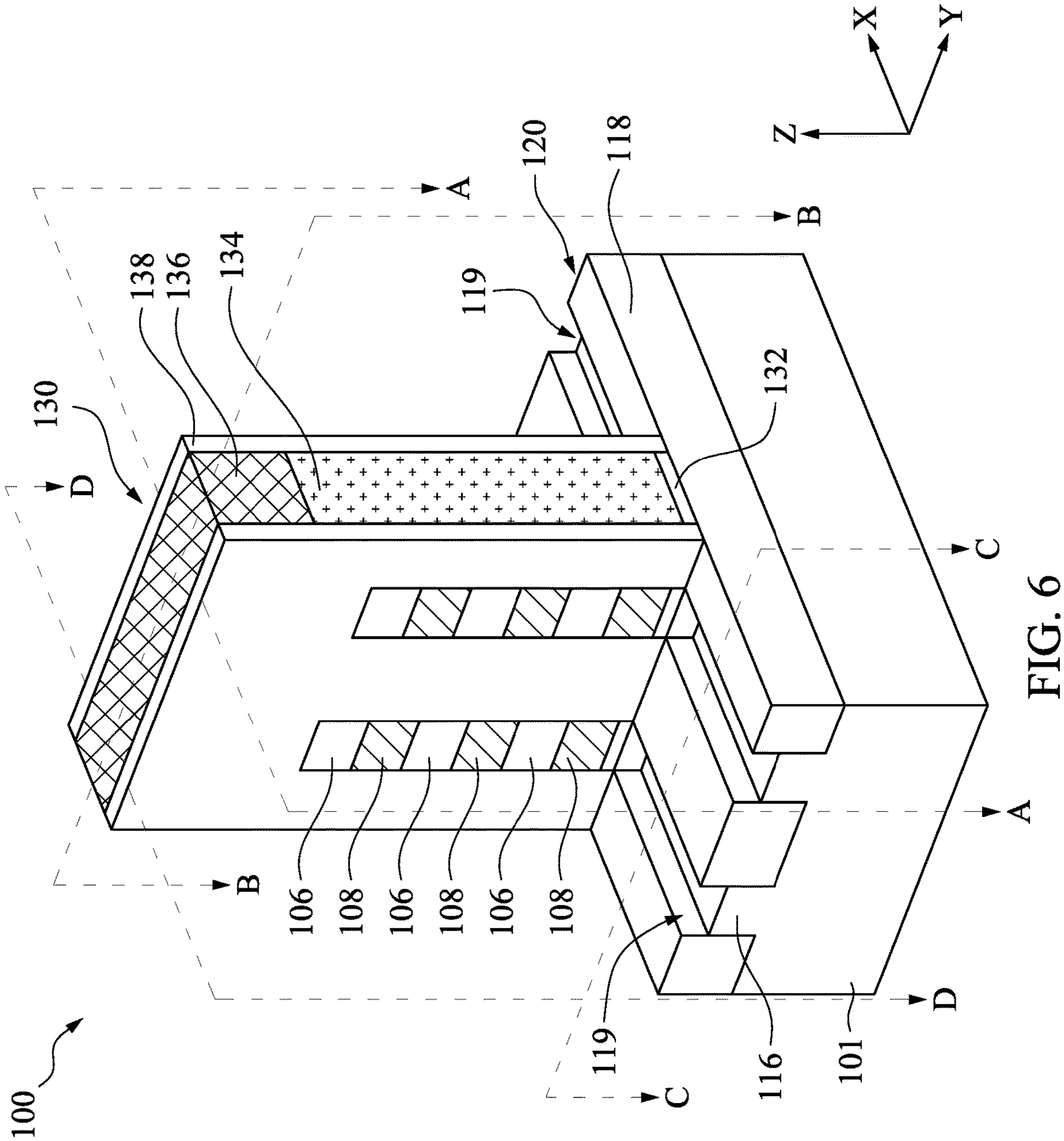

In FIG. 6, the portions of the fin structures 112 in the S/D regions (e.g., regions on opposite sides of the sacrificial gate structure 130) are recessed down below the top surface of the isolation region 120 (or the insulating material 118), by removing portions of the fin structures 112 not covered by the sacrificial gate structure 130. The recess of the portions of the fin structures 112 can be done by an etch process, either isotropic or anisotropic etch process, or further, may be selective with respect to one or more crystalline planes of the substrate 101. The etch process may be a dry etch, such as a RIE, NBE, or the like, or a wet etch, such as using tetramethyalammonium hydroxide (TMAH), ammonium hydroxide ($NH_4OH$), or any suitable etchant. Trenches 119 are formed in the S/D regions as the result of the recess of the portions of the fin structures 112.

Figure 7A:
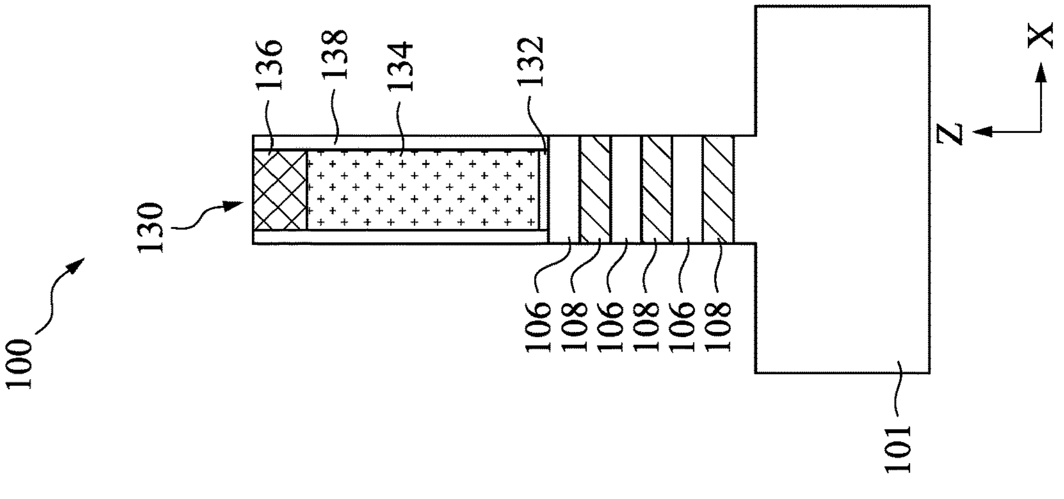
FIGS. 7A, 7B, and 7C are cross-sectional side views of the semiconductor device structure taken along line A-A, line B-B, and line C-C of FIG. 6, respectively.
Figure 7B:
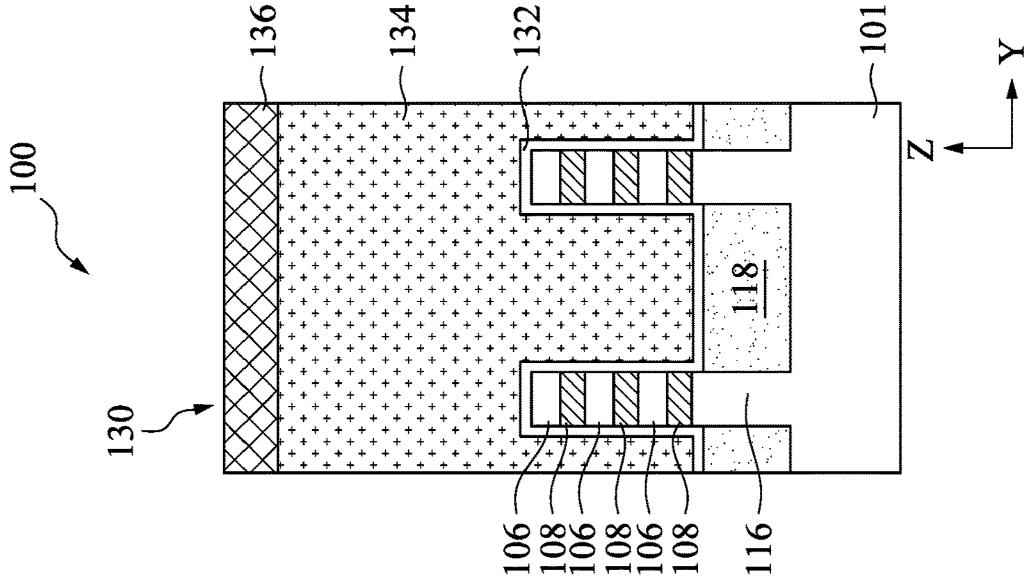
Figure 7C:
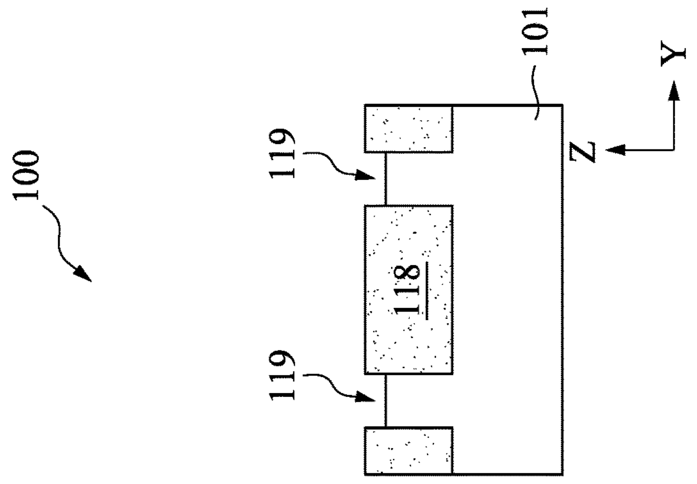

FIGS. 7A, 7B, and 7C are cross-sectional side views of the semiconductor device structure 100 taken along line A-A, line B-B, and line C-C of FIG. 6, respectively. FIGS.

8A-13A are cross-sectional side views of various stages of manufacturing the semiconductor device structure 100 taken along cross-section A-A of FIG. 6, in accordance with some embodiments. FIGS. 8B-13B are cross-sectional side views of various stages of manufacturing the semiconductor device structure 100 taken along cross-section B-B of FIG. 6, in accordance with some embodiments. FIGS. 8C-13C are cross-sectional side views of various stages of manufacturing the semiconductor device structure 100 taken along cross-section C-C of FIG. 6, in accordance with some embodiments. Cross-section A-A is in a plane of the fin structure 112 along the X direction. Cross-section B-B is in a plane perpendicular to cross-section A-A and is in the sacrificial gate structure 130. Cross-section C-C is in a plane perpendicular to cross-section A-A and is in the source/drain region (e.g., epitaxial S/D features 146 shown in FIG. 9A) along the Y-direction.

Figure 8A:
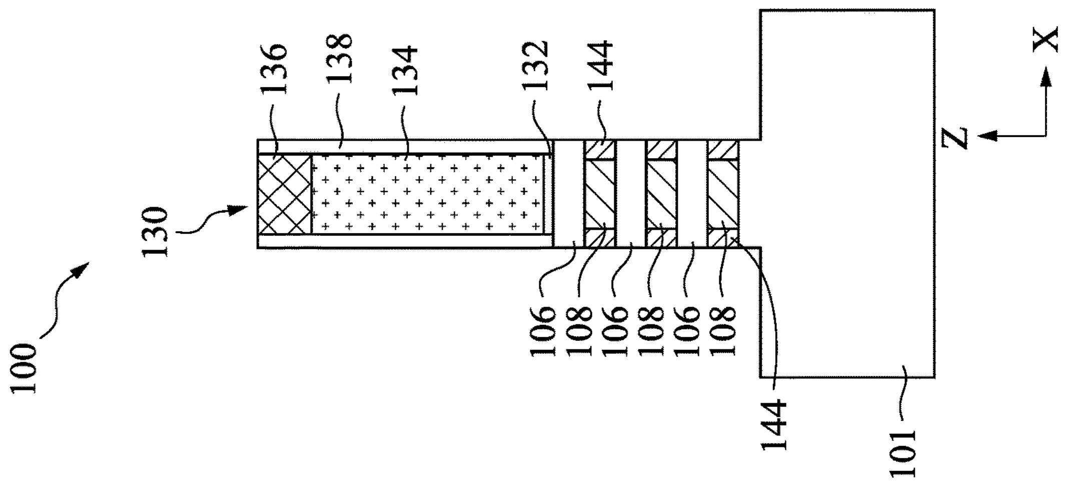
Figure 8B:
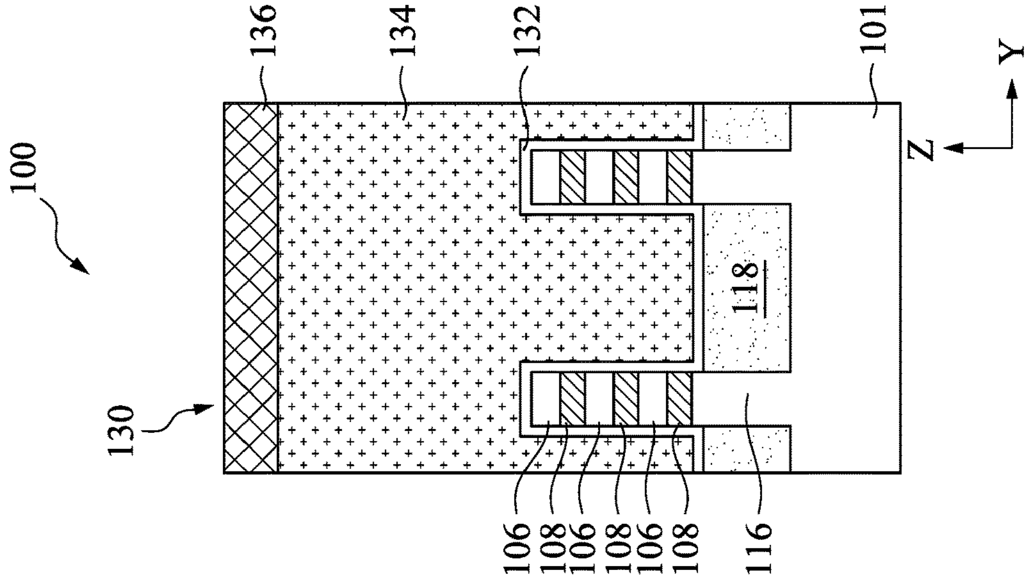
Figure 8C:
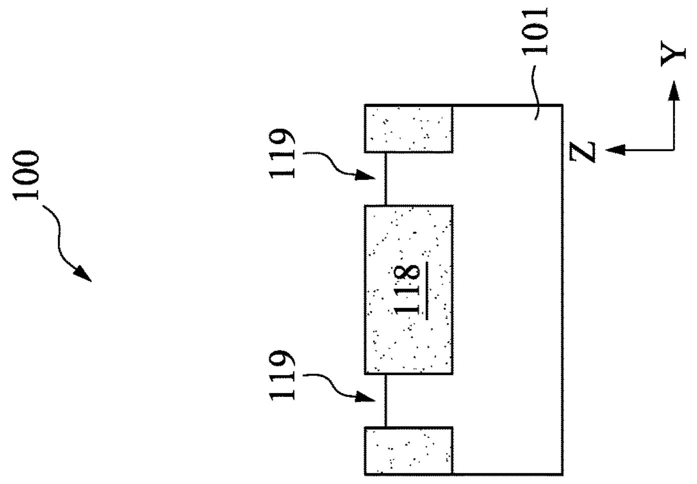

In FIGS. 8A-8C, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers (or so-called inner spacer) 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figure 9C:
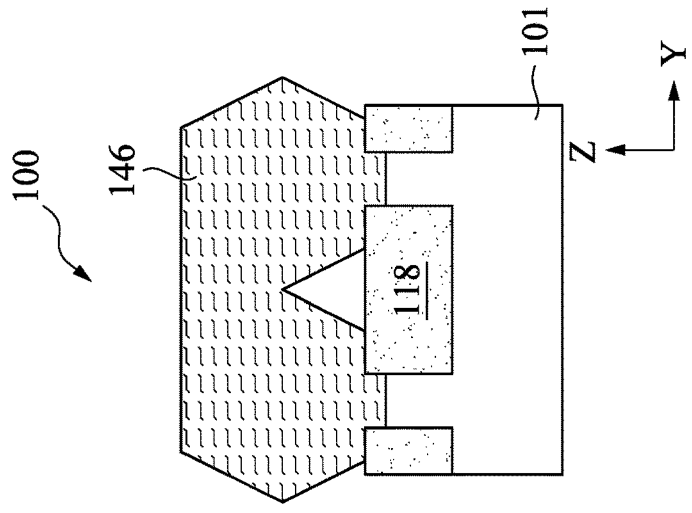
Figure 9B:
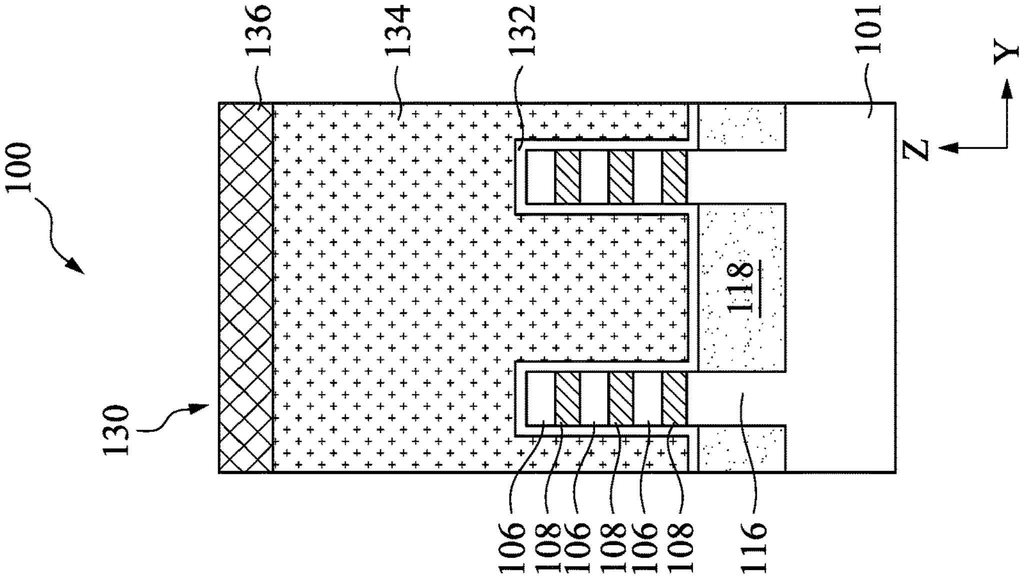
Figure 9A:
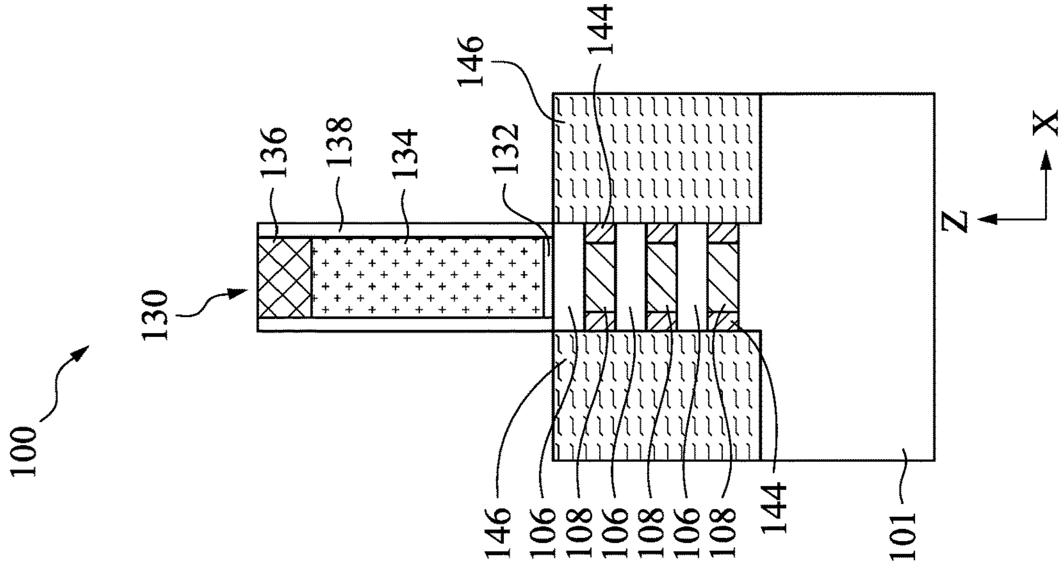

In FIGS. 9A-9C, epitaxial S/D features 146 are formed in the source/drain (S/D) regions. The epitaxial S/D features 146 may be made of one or more layers of Si, SiP, SiC and SiCP for n-channel FETs or Si, SiGe, Ge for p-channel FETs. For p-channel FETs, P-type dopants, such as boron (B), may also be included in the epitaxial S/D features 146. The epitaxial S/D features 146 may be formed by an epitaxial growth method using CVD, ALD or MBE.

In one example shown in FIG. 9A, one of a pair of epitaxial S/D features 146 disposed on one side of the sacrificial gate structure 130 is designated as a source feature/terminal, and the other of the pair of epitaxial S/D features 146 disposed on the other side of the sacrificial gate structure 130 is designated as a drain feature/terminal. The source feature/terminal and the drain feature/terminal are connected by the channel layers (e.g., the first semiconductor layers 106). The epitaxial S/D features 146 are in contact with the first semiconductor layer 106 under the sacrificial gate structure 130. In some cases, the epitaxial S/D features 146 may grow pass the topmost semiconductor channel, i.e., the first semiconductor layer 106 under the sacrificial gate structure 130, to be in contact with the gate spacers 138. The second semiconductor layer 108 under the sacrificial gate structure 130 are separated from the epitaxial S/D features 146 by the dielectric spacers 144.

The epitaxial S/D features 146 may grow both vertically and horizontally to form facets, which may correspond to crystalline planes of the material used for the substrate 101. In some cases, the epitaxial S/D features 146 of a fin structure may grow and merge with the epitaxial S/D features 146 of the neighboring fin structures, as one example shown in FIG. 9C.

Figure 10C:
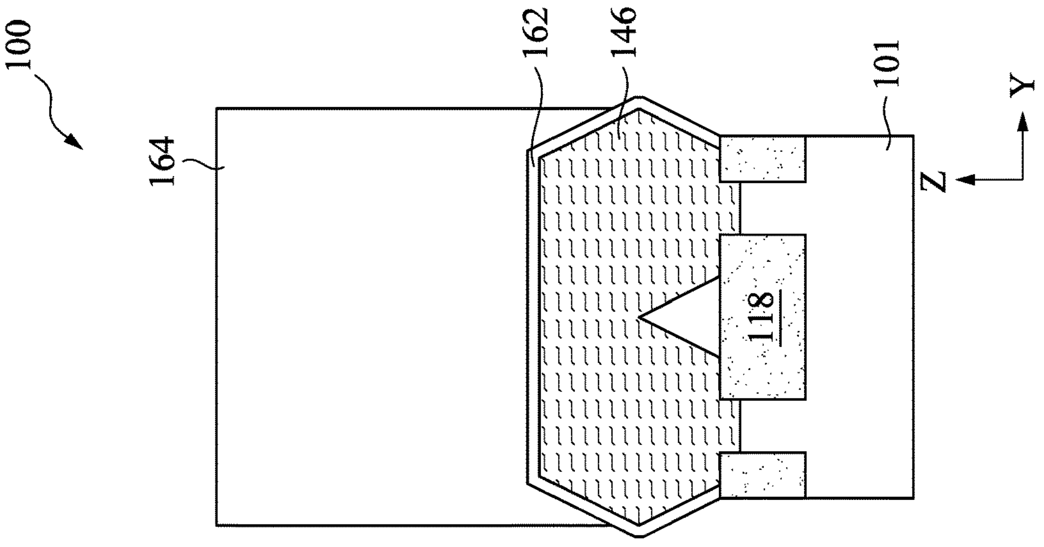
Figure 10B:
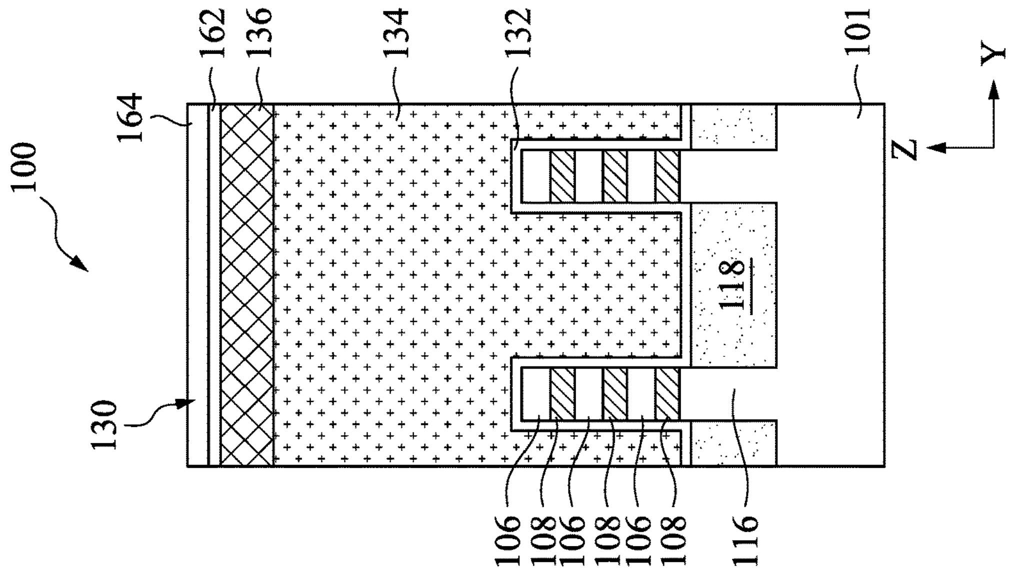
Figure 10A:
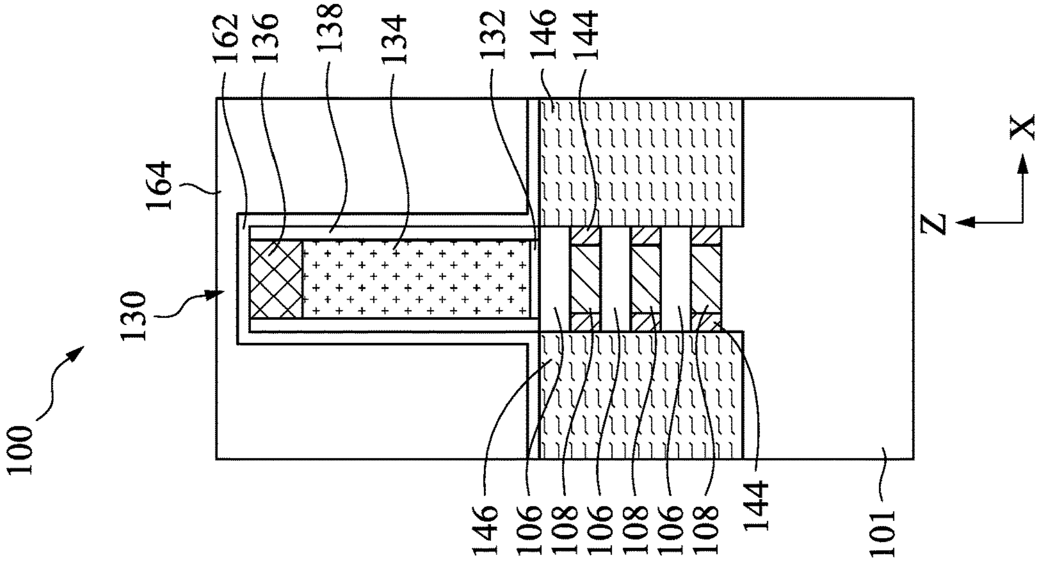

In FIGS. 10A-10C, a contact etch stop layer (CESL) 162 is conformally formed on the exposed surfaces of the semiconductor device structure 100. The CESL 162 covers the sidewalls of the sacrificial gate structure 130, the insulating material 118, the epitaxial S/D features 146, and the exposed surface of the stack of semiconductor layers 104. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) layer 164 is formed on the CESL 162 over the semiconductor device structure 100. The materials for the first ILD layer 164 may include compounds comprising Si, O, C, and/or H, such as silicon oxide, TEOS oxide, SiCOH and SiOC. Organic materials, such as polymers, may also be used for the first ILD layer 164. The first ILD layer 164 may be deposited by a PECVD process or other suitable deposition technique. In some embodiments, after formation of the first ILD layer 164, the semiconductor device structure 100 may be subject to a thermal process to anneal the first ILD layer 164.

Figures 11A, 11B, 11C:
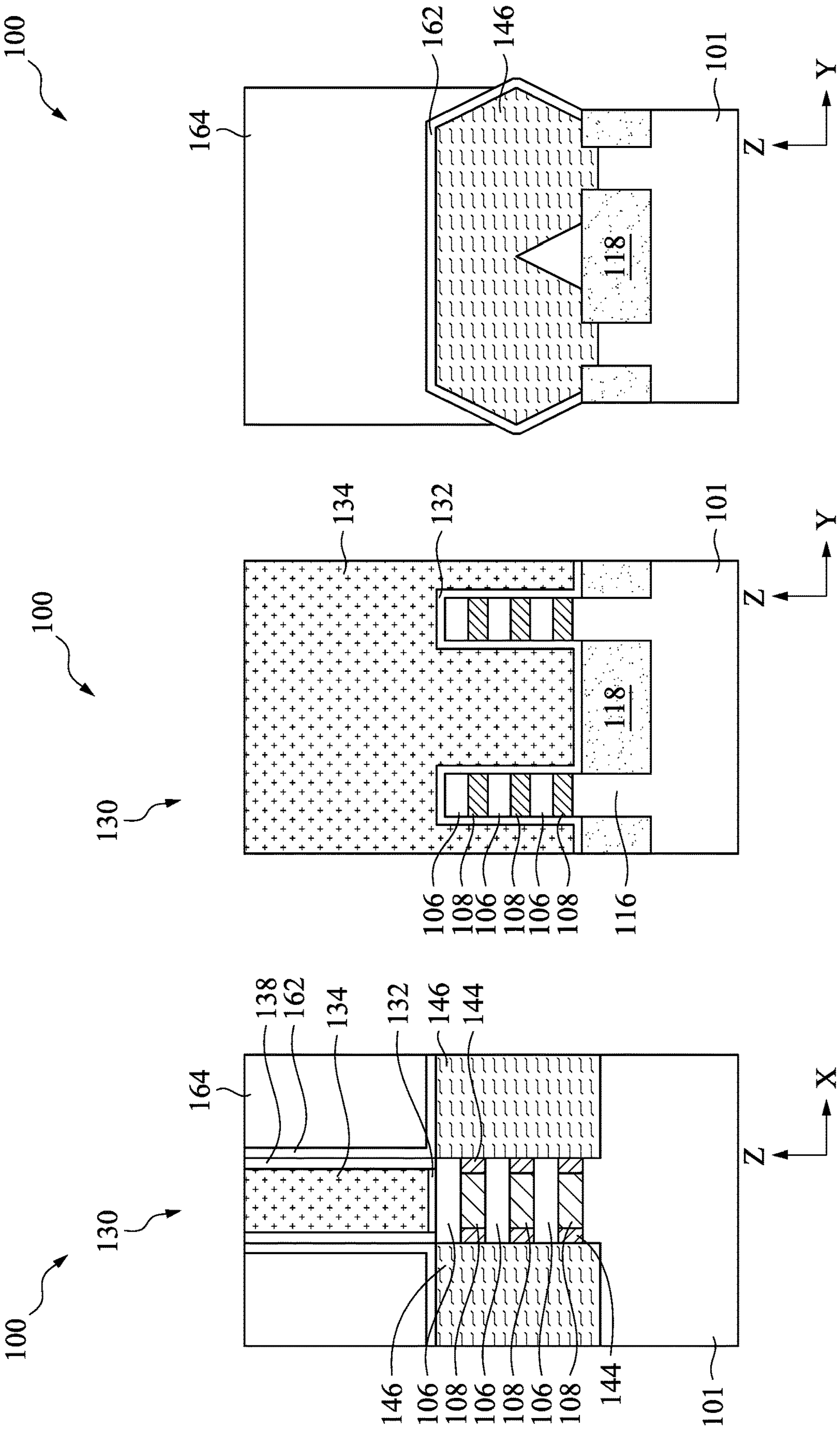

In FIGS. 11A-11C, after the first ILD layer 164 is formed, a planarization operation, such as CMP, is performed on the semiconductor device structure 100 until the sacrificial gate electrode layer 134 is exposed.

Figure 12C:
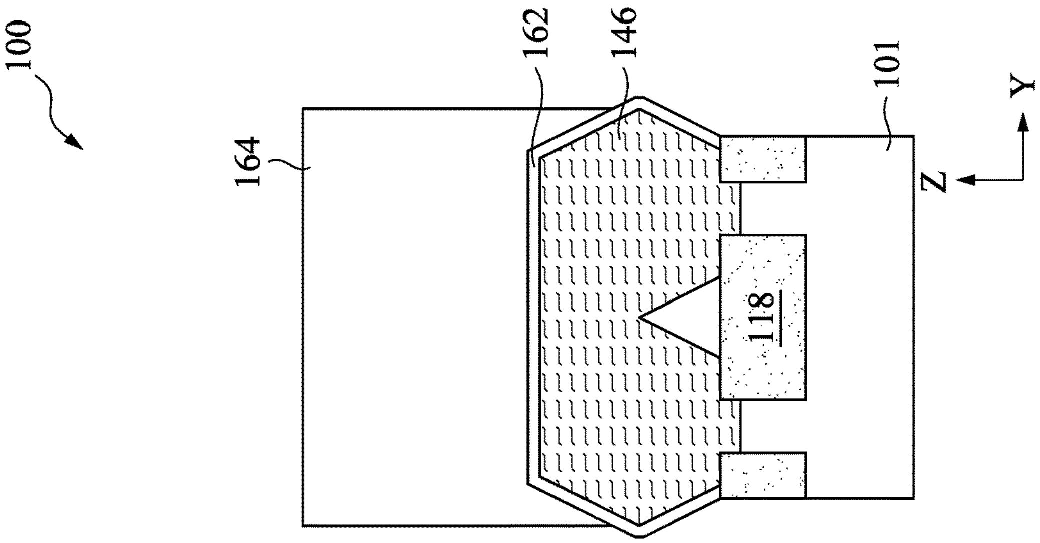
Figure 12B:
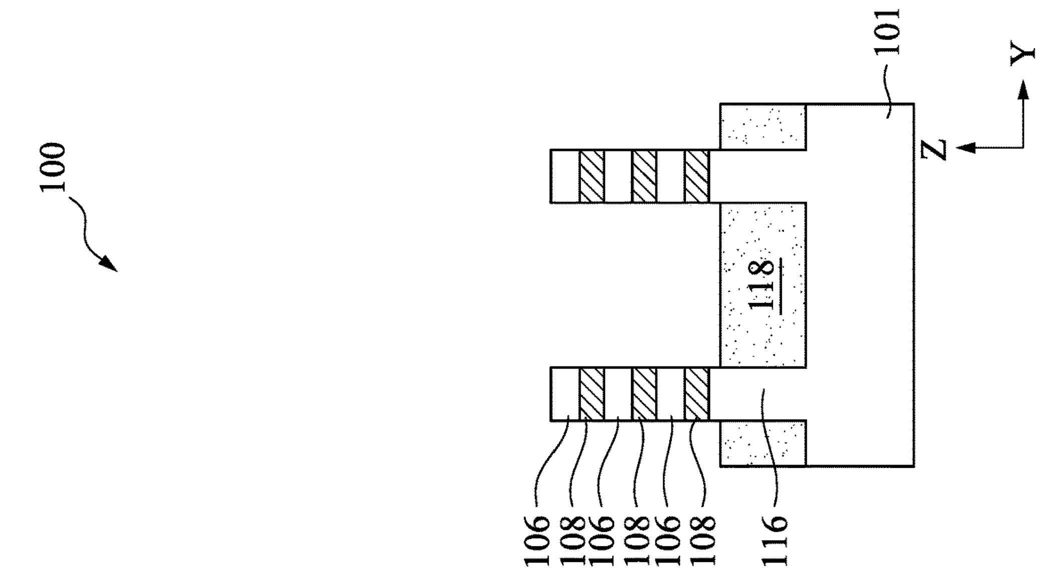
Figure 12A:
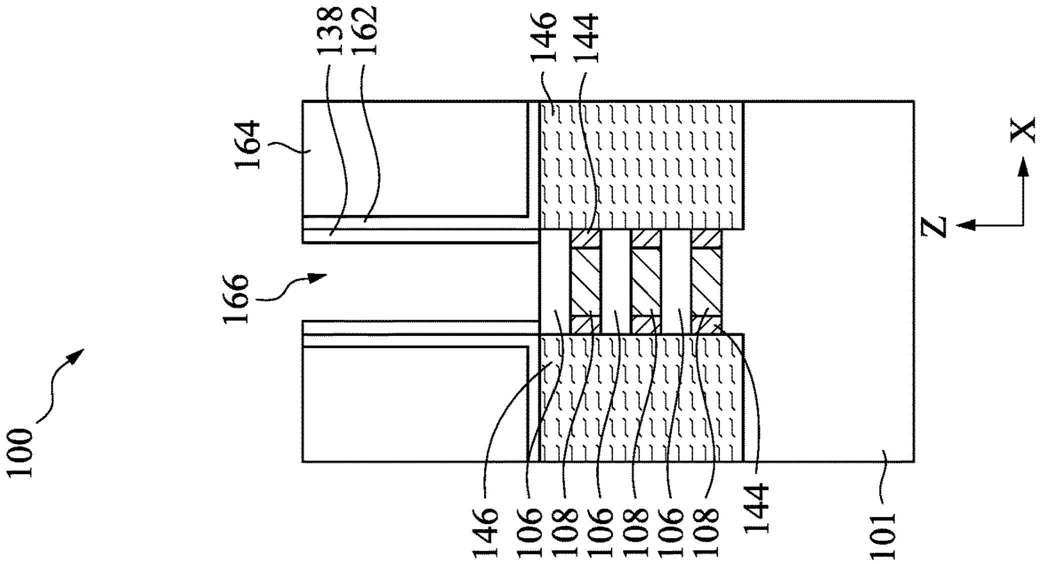

In FIGS. 12A-12C, the sacrificial gate structure 130 is removed. The first ILD layer 164 protects the epitaxial S/D features 146 during the removal of the sacrificial gate structure 130. The sacrificial gate structure 130 can be removed using plasma dry etching and/or wet etching. For example, in cases where the sacrificial gate electrode layer 134 is polysilicon and the first ILD layer 164 is silicon oxide, a wet etchant such as a tetramethylammonium hydroxide (TMAH) solution can be used to selectively remove the sacrificial gate electrode layer 134 without removing the dielectric materials of the first ILD layer 164, the CESL 162, and the gate spacers 138. The sacrificial gate dielectric layer 132 is thereafter removed using plasma dry etching and/or wet etching. The removal of the sacrificial gate structure 130 (i.e., the sacrificial gate electrode layer 134 and the sacrificial gate dielectric layer 132) forms a trench 166 in the regions where the sacrificial gate electrode layer 134 and the sacrificial gate dielectric layer 132 were removed. The trench 166 exposes the top and sides of the stack of semiconductor layers 104 (e.g., the first semiconductor layers 106 and the second semiconductor layers 108).

Figure 13C:
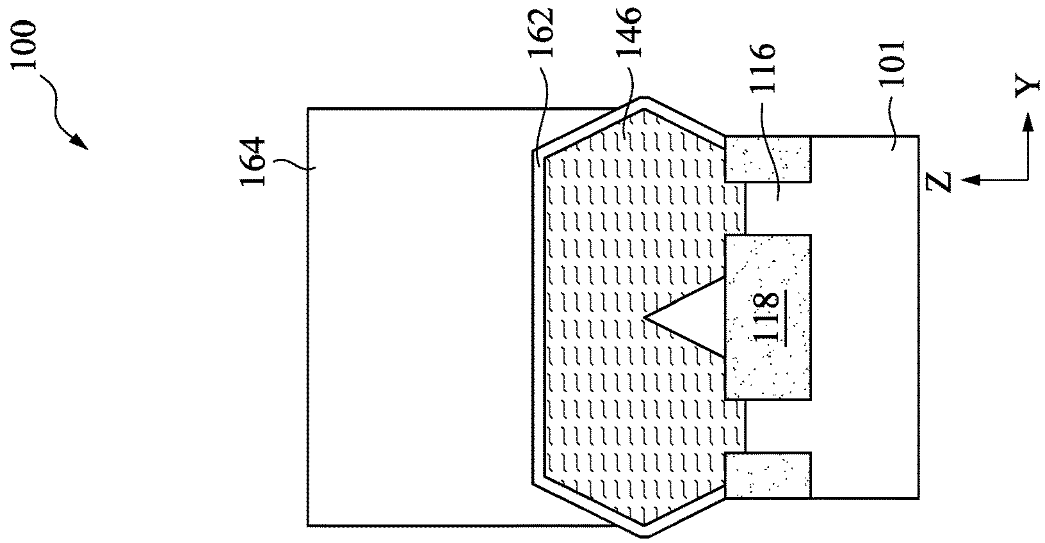
Figure 13B:
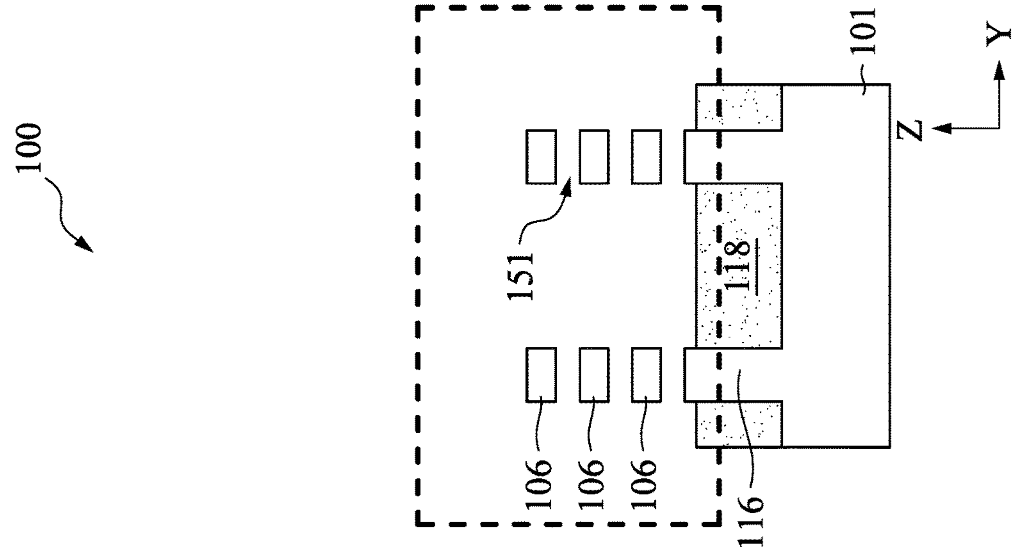
Figure 13A:
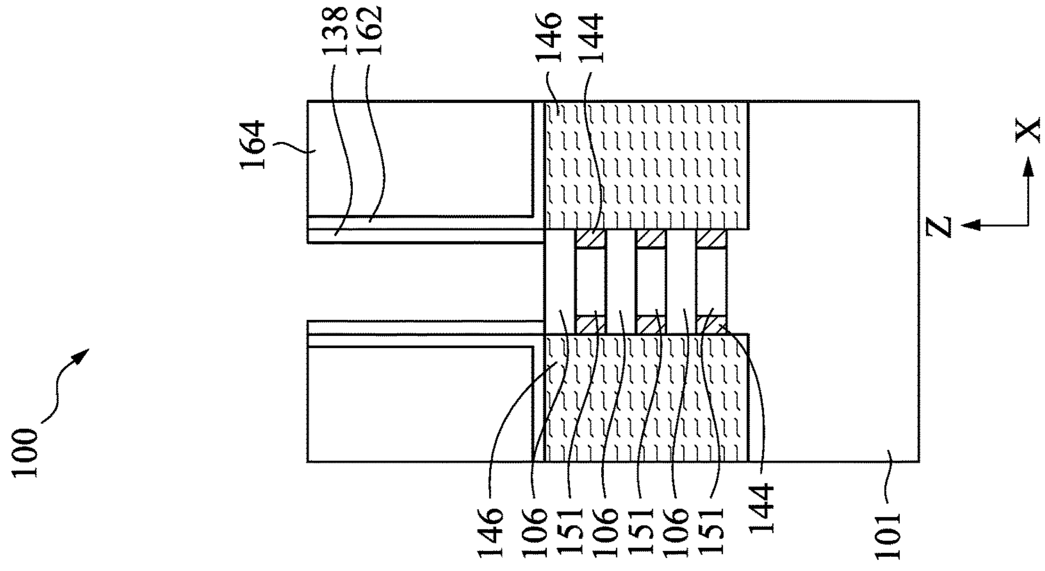

In FIGS. 13A-13C, the exposed second semiconductor layers 108 are removed. The removal of the second semiconductor layers 108 exposes the dielectric spacers 144 and the first semiconductor layers 106. In some embodiments, a small amount (e.g., about 1 nm to about 2.5 nm in terms of thickness) of the first semiconductor layer 106 may be removed during the removal of the second semiconductor layers 108. The removal process may be any suitable etch processes, such as dry etch, wet etch, or a combination thereof. The etch process may be a selective etch process that removes the second semiconductor layers 108 but not the gate spacers 138, the CESL 162, the first ILD layer 164, and the first semiconductor layers 106. As a result, openings 151 are formed around the first semiconductor layers 106, and the portion of the first semiconductor layers 106 not covered by the dielectric spacers 144 is exposed to the openings 151.

Figure 14:
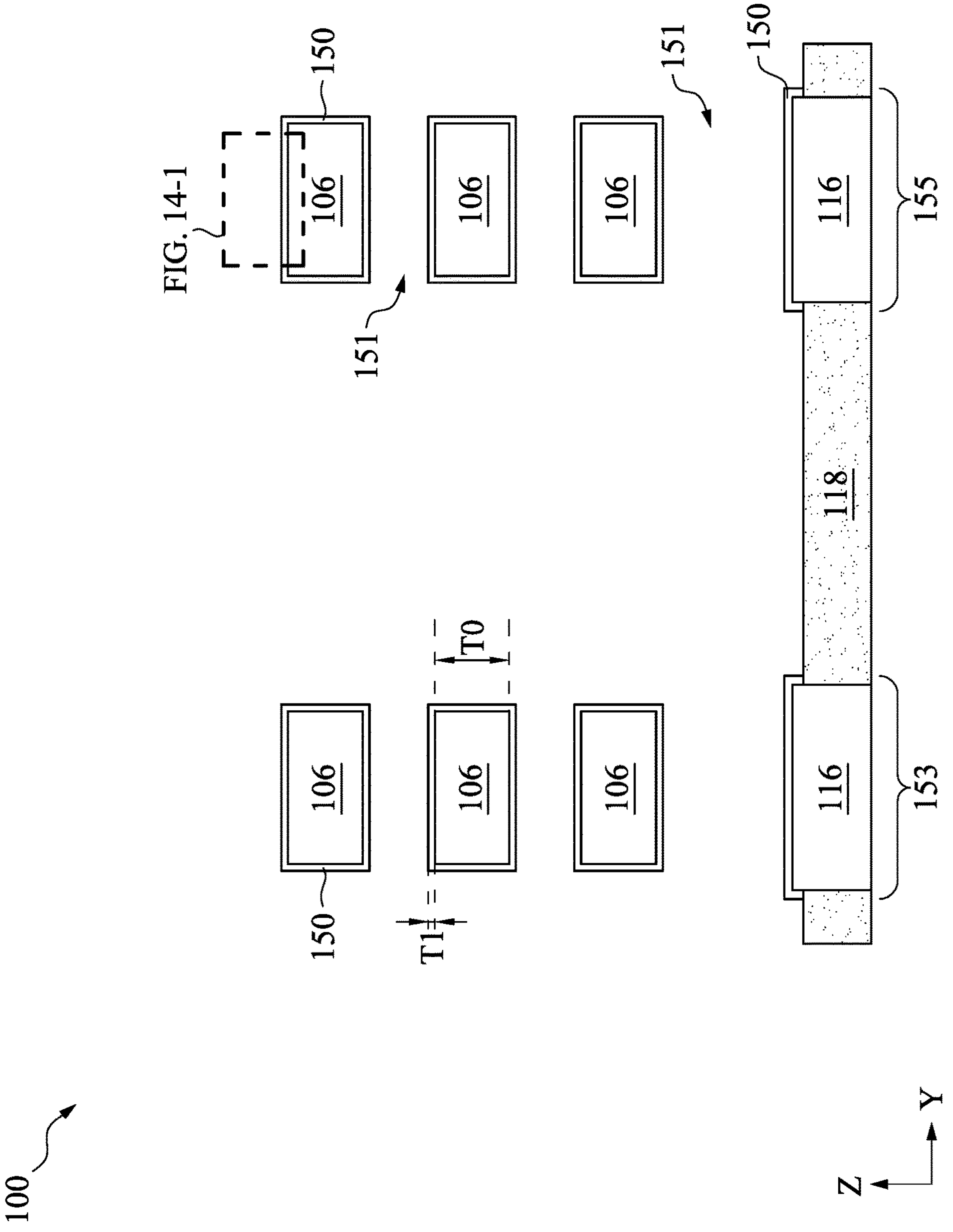
FIGS. 14-23 are cross-sectional side views of various stages of manufacturing the semiconductor device structure taken along line B-B of FIG. 6, in accordance with some embodiments.
Figures 1, 14:
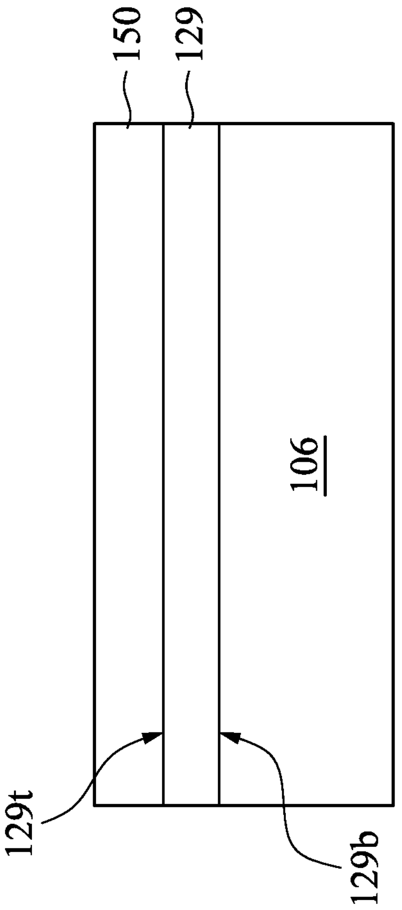

FIGS. 14-23 are cross-sectional side views of various stages of manufacturing the semiconductor device structure 100 taken along line B-B of FIG. 6, in accordance with some embodiments. In FIG. 14, a cladding layer 150 is formed to surround the exposed surfaces of the first semiconductor layers 106 (i.e., nanosheet channels) and on the well portion 116 of the substrate 101. In some embodiments, the exposed surfaces of the first semiconductor layers 106 are silicon (100) planes. The nanosheet transistor at the region 153 may be designated as a P-type FET or N-type FET, and the region 155 may be designated as an N-type FET or P-type FET. Alternatively, both regions 153, 155 may be designated as a P-type FET or N-type FET. In the embodiment shown in FIG. 14, the nanosheet transistor at the region 153 is designated as a N-type FET and the nanosheet transistor at the region 155 is designated as a P-type FET. In any case, the cladding layer 150 serves to enhance the mobility of hole carriers for PMOS nanosheet transistors. In various embodiments, the cladding layer 150 is a germanium-containing material or the like. In one embodiment, the cladding layer 150 is silicon germanium (SiGe). In cases where the cladding layer 150 is formed of SiGe, the semiconductive surfaces of the first semiconductor layers 106 and the well portion 116 promote selective growth of the cladding layer 150 thereon, with little or no cladding layer 150 grown on the dielectric surfaces of the insulating material 118. In one embodiment, the cladding layer 150 is SiGe having a Ge atomic percentage in a range of about 20 at. % to about 100 at. %. In some embodiments, the cladding layer 150 is a pure germanium. The term "pure germanium" used herein refers to a material having at least 99.9% by weight of germanium element.

The cladding layer 150 can be formed by ALD, Atomic Layer Epitaxy (ALE), CVD, or any suitable conformal deposition technique to ensure uniform thickness of the cladding layer 150. Suitable source gas may include germanium-containing gas, which can be germane ($GeH_4$) or higher germanes, such as compounds with the empirical formula $Ge_xH_{(2x+2)}$, for example, digermane ($Ge_2H_6$), trigermane ($Ge_3H_8$), and tetragermane ($Ge_4H_{10}$), etc. Chlorinated germanium derivatives, such as germanium dichloride ($GeCl_2$), germanium tetrachloride ($GeCl_4$), or dichlorogermane ($GeCl_2H_2$), may also be used. Suitable gases for the silicon-containing precursor may include silane ($SiH_4$), dimethylsilane ($(CH_3)_2SiH_2$), methylsilane ($SiH(CH_3)_3$), dichlorosilane ($SiH_2Cl_2$, DCS), trichlorosilane ($SiHCl_3$, TCS), or any suitable gases comprising Si, N, H, and optionally C in its molecule.

The cladding layer 150 has a uniform thickness on the exposed surfaces of the first semiconductor layers 106 and on the well portion 116 of the substrate 101. The thickness of the cladding layer 150 may be chosen based on device performance considerations and/or the threshold voltage needed for the nanosheet transistor. In some embodiments, the cladding layer 150 has a thickness T1 and the first semiconductor layer 106 has a thickness TO, and a ratio of the T1:T0 is in a range of about 1:5 to about 1:30. In some embodiments, the cladding layer 150 has a thickness T1 in a range of about 1 nm to about 5 nm. If the thickness T1 of the cladding layer 150 is less than about 1 nm, the cladding layer 150 may not function as intended for effective tuning of the threshold voltage for the P-type and/or N-type FETs. On the other hand, if the thickness T1 of the cladding layer 150 is more than 5 nm, the space created between nanosheet channels (e.g., first semiconductor layers 106) may not be enough for the subsequent layers (e.g., capping layer 157, HK dielectric layer 160, and gate electrode layer 165, etc.)

In some embodiments, the semiconductor device structure 100 is optionally subjected to a thermal treatment. Germanium in the cladding layer 150 are diffused into and mixed with silicon of the first semiconductor layers 106 and the well portion 116 to form an intermixed layer 129 as a result of the thermal treatment. The intermixed layer 129 can be considered as modified first semiconductor layer 106/well portion 116. The term "intermixed layer" as used in this disclosure denotes a reaction product of the first semiconductor layers 106/well portion 116 and the cladding layer 150, which can be a compound, a composition or a mixture, depending on the thermal treatment used. In some embodiments, the intermixed layer 129 can be a first semiconductor layer 106 doped with materials from the cladding layer 150. The thermal treatment may be performed in-situ or ex-situ and can be any type of anneal, such as rapid thermal anneal, a spike anneal, a soak anneal, a laser anneal, etc. The thermal treatment may be performed for about 0.05 seconds to about 1 minute, such as about 10 seconds to about 30 seconds, and at a temperature range of about 450° C. to about 1200° C. The thermal treatment may be performed in an atmosphere of gas, such as an oxygen-containing gas, a hydrogen-containing gas, an argon-containing gas, a helium-containing gas, or any combinations thereof. Exemplary gas may include, but are not limited to, $N_2$, $NH_3$, $O_2$, $N_2O$, Ar, He, H, etc.

FIG. 14-1 is an enlarged view of a portion of the semiconductor device structure 100 showing the intermixed layer 129 formed between the first semiconductor layer 106 and the cladding layer 150, in accordance with some embodiments. The intermixed layer 129 has a SiGe concentration profile gradually and continuously changed along the thickness of the intermixed layer 129. In one embodiment, the intermixed layer 129 has a first concentration of SiGe at and/or near an interface 129*t* of the intermixed layer 129 and the cladding layer 150 and the portions of the intermixed layer 129 at and/or near an interface 129*b* of the intermixed layer 129 and the first semiconductor layer 106 have a second concentration of SiGe that is lower than the first concentration of SiGe.

Figure 15:
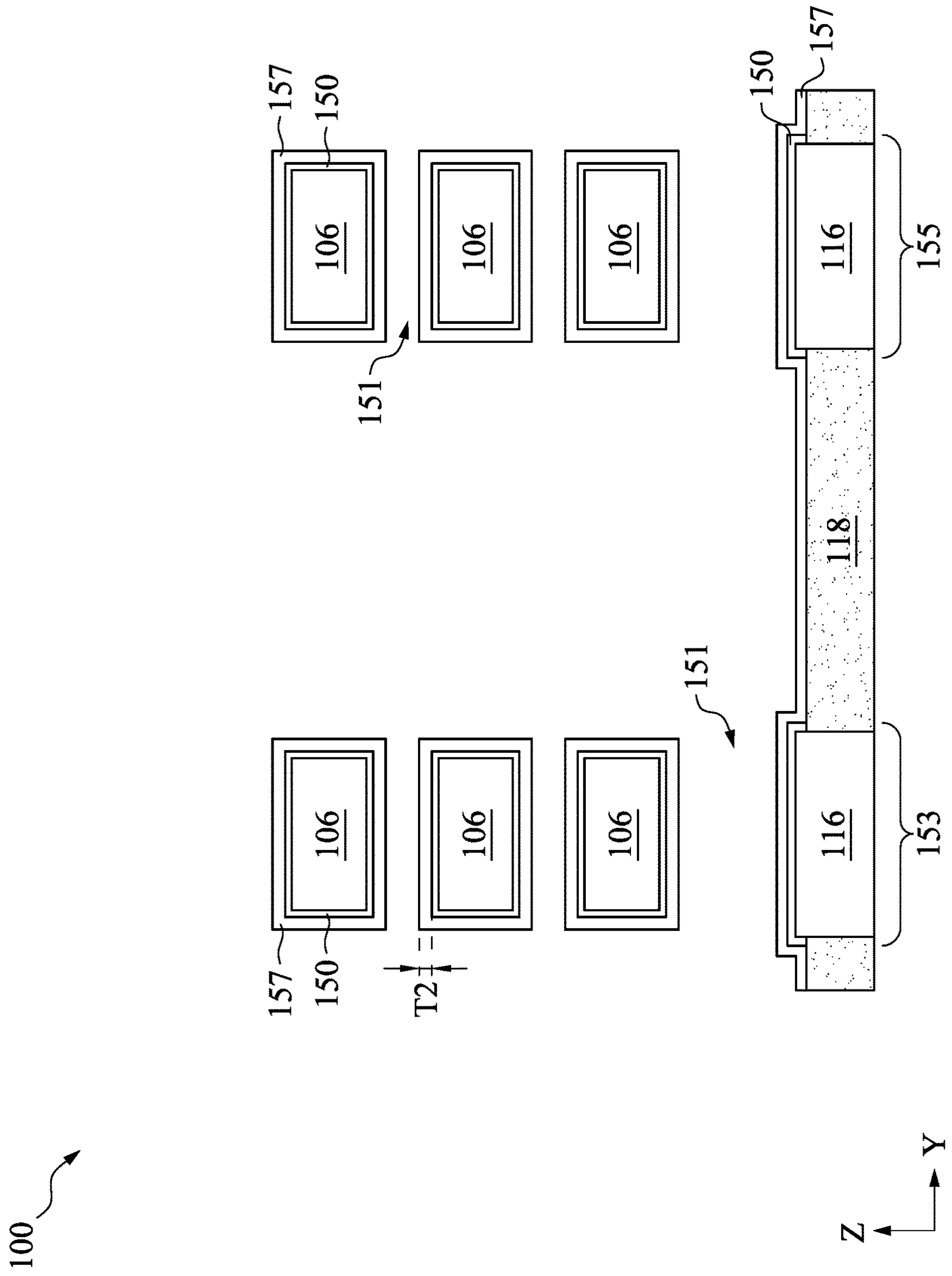

In FIG. 15, an optional capping layer 157 is formed on the exposed surfaces of the semiconductor device structure 100. The capping layer 157 is formed on the cladding layer 150 to surround the surfaces of the first semiconductor layers 106 and over the well portion 116 of the substrate 101. In some embodiments, the capping layer 157 may also form on a portion of the insulating material 118. The capping layer 157 prevent germanium in the underlying cladding layer 150 from outgassing during the subsequent process, such as a pre-clean process or a thermal drive-in process. The capping layer 157 may have a composition (including the elements contained therein and the percentage of the elements) different from the composition of the cladding layer 150. In some embodiments, the capping layer 157 may include or be made of an oxygen-containing material or a silicon-containing material, such as oxide, silicon oxide, silicon oxynitride, oxynitride, silicon nitride, silicon carbonitride, silicon oxycarbide, or the like, and may be formed by any suitable technique, such as ALD (thermal-ALD or PEALD), CVD, ozone oxidation, or any suitable conformal deposition process. In some embodiments, the capping layer 157 is a high-K dielectric such as HfO, $Al_2O_3$, or the like.

In some embodiments, the capping layer is an oxide formed by oxidizing an outer portion of the cladding layer 150. Therefore, the outer portion surrounds and in contact with the core cladding layer 150 upon completion of the oxidation. In cases where the cladding layer 150 is formed of germanium or silicon germanium, the cladding layer 150 may have the outer portion in the form of either (Si, Ge)$O_2$ or germanium oxide (e.g., $GeO_2$) or silicon oxide (e.g., SiO2), and the inner portion containing germanium or silicon germanium. In some embodiments, the concentration of germanium in the germanium oxide is from about 10 at. % to about 50 at. %. In some embodiments, the concentration of silicon in the silicon oxide is from about 10 at. % to about 50 at. %. The capping layer 157 may be formed using an oxidation process such as thermal oxidation process, a rapid thermal oxidation (RTO) process, an in-situ stream generation (ISSG) process, or an enhanced in-situ stream generation (EISSG) process. In one example, the capping layer 157 is formed by subjecting the cladding layer 150 to a rapid thermal anneal (RTA) in an oxygen-containing environment. The thermal oxidation may be performed at a temperature of about 600 degrees Celsius to about 1100 degrees Celsius, for a time span of about 10 seconds to about 30 seconds. The temperature and time span of the oxidation may contribute to the thickness of the capping layer 157. For example, higher temperatures and longer oxidation time spans may result in a thicker capping layer 157. The capping layer 157 may have a thickness T2 in a range of about 0.01 nm to about 5 nm, such as about 0.05 to about 1 nm, which varies depending on the thickness and oxidation of the cladding layer 150.

Figure 16:
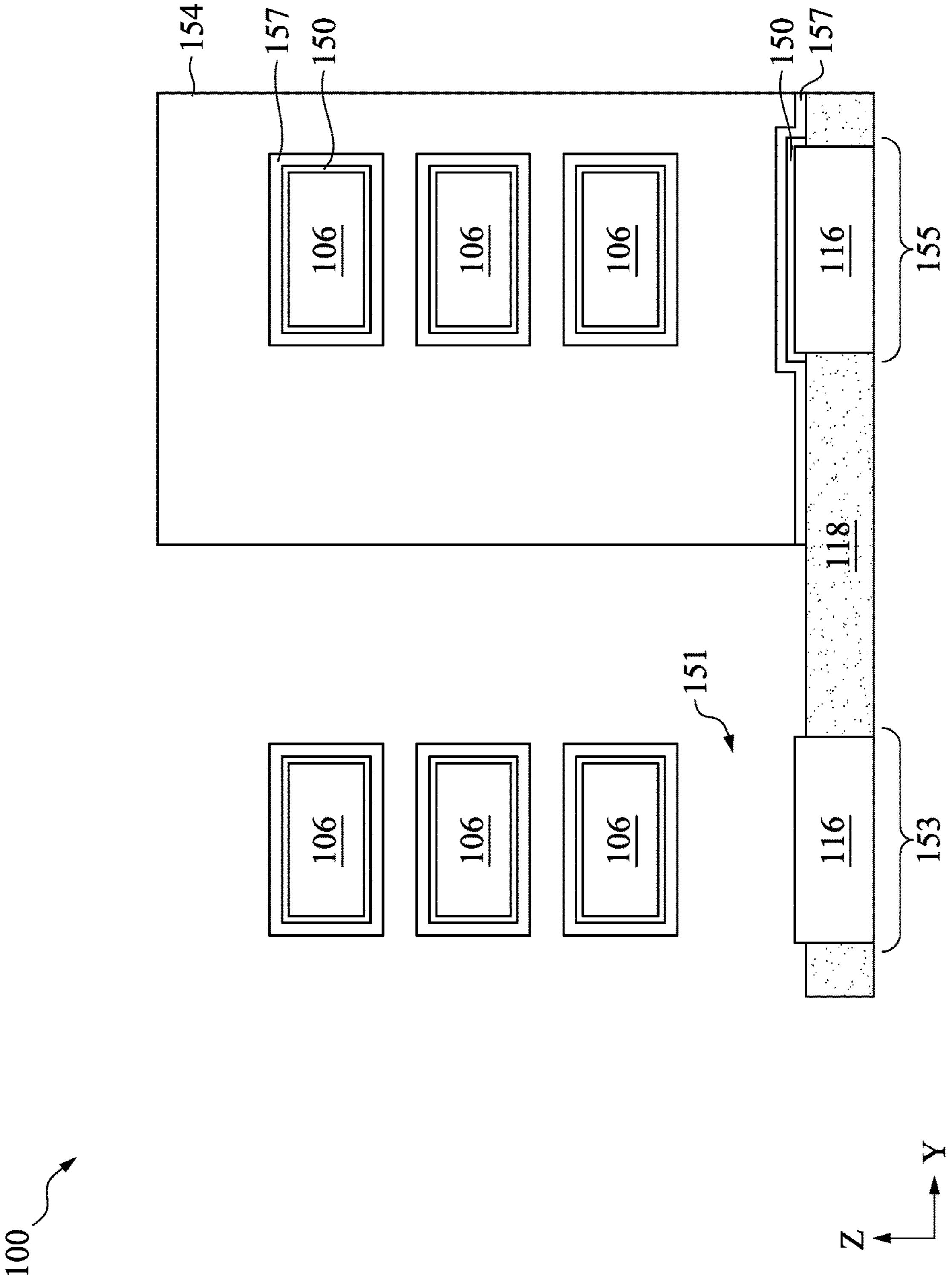

In FIG. 16, a mask layer 154 is formed to cover at least the nanosheet transistor at the region 155, which is designated as a P-type FET in some embodiments, and the capping layer 157 and the cladding layer 150 at the region 153 are removed. The mask layer 154 first fills the openings 151 (FIG. 15) to a level so that the nanosheet transistors at the regions 153, 155 are all submerged in the mask layer 154. The mask layer 154 protects the capping layer 157 and the cladding layer 150 at the region 155 during the subsequent etching process of the capping layer 157 and the cladding layer 150 at the region 153. The mask layer 154 may be any suitable masking material, such as a photoresist layer, a BARC (bottom anti-reflective coating) layer, a SOG (spin-on-glass) layer, or a SOC (spin-on-carbon) layer, and may be deposited by spin coating or any suitable deposition technique. Next, the mask layer 154 is patterned and etched to expose the capping layer 157 over the nanosheet transistor and the well portion 116 at the region 153, which is designated as a N-type FET in some embodiments. The mask layer 154 at the region 153 may then be removed using ash process and/or any suitable etch process.

Once the mask layer 154 at the region 153 is removed, one or more etch processes, such as dry etch, wet etch, or a combination thereof, are performed to remove the capping layer 157 and the cladding layer 150 at the region 153 not covered by the mask layer 154. The etch processes expose the surfaces of the first semiconductor layers 106, the well portion 116, and the insulating material 118 at the region 153. In one embodiment, the etch process is a selective wet etching process that selectively removes the capping layer 157 and the cladding layer 150 but does not remove the first semiconductor layers 106 and the well portion 116. In cases where the cladding layer 150 includes SiGe or Ge and the first semiconductor layers 106 and the well portion 116 are made of Si, the etchant used in the selective wet etching process removes the SiGe but not substantially affecting Si. For example, the capping layer 157 and the cladding layer 150 may be removed using a wet etchant such as, but not limited to, hydrofluoric (HF), nitric acid ($HNO_3$), hydrochloric acid (HCl), phosphoric acid ($H_3PO_4$), a dry etchant such as fluorine-based (e.g., $F_2$) or chlorine-based gas (e.g., $Cl_2$), or any suitable isotropic etchants.

Figure 17:
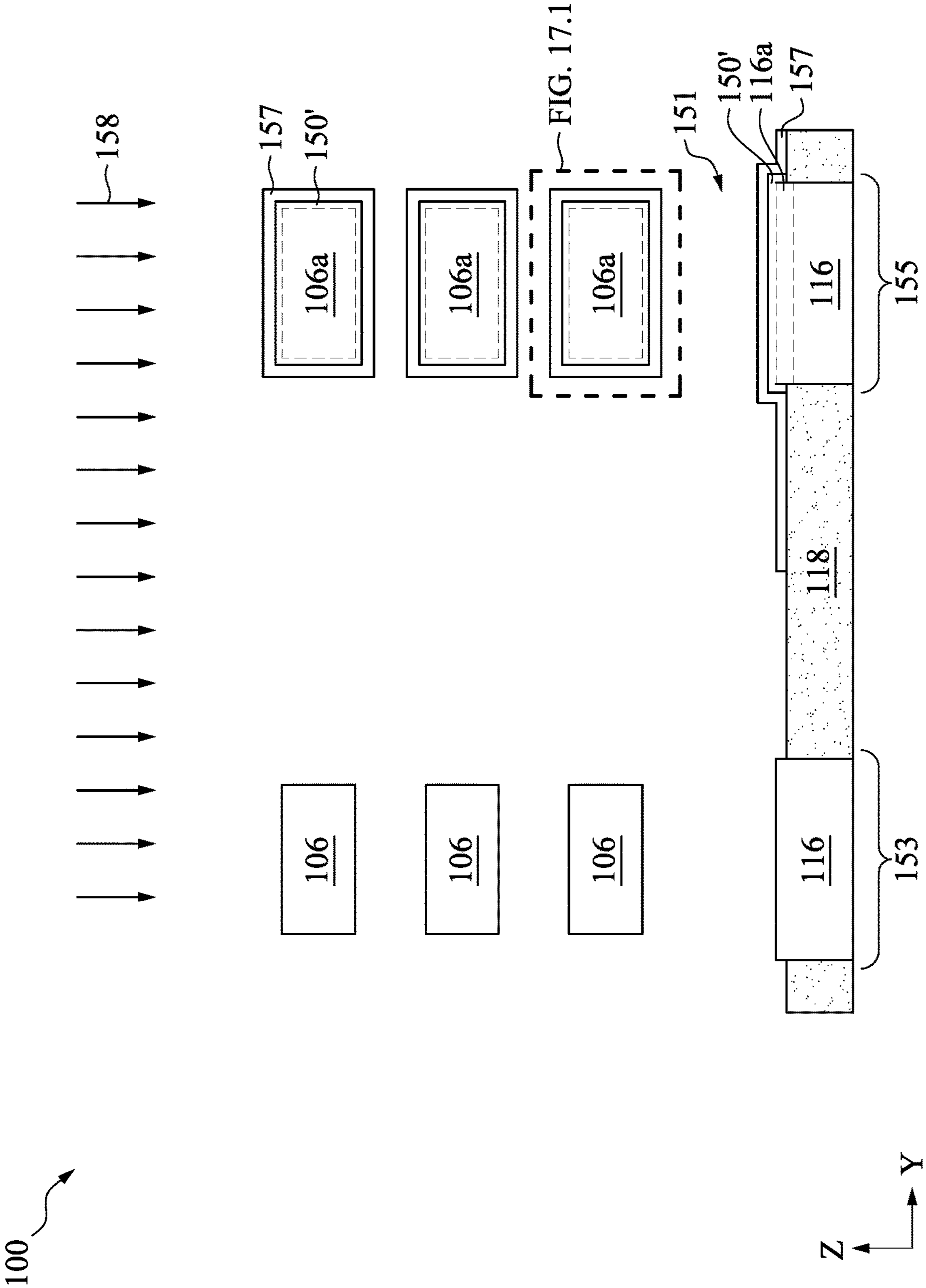
Figures 1, 17:
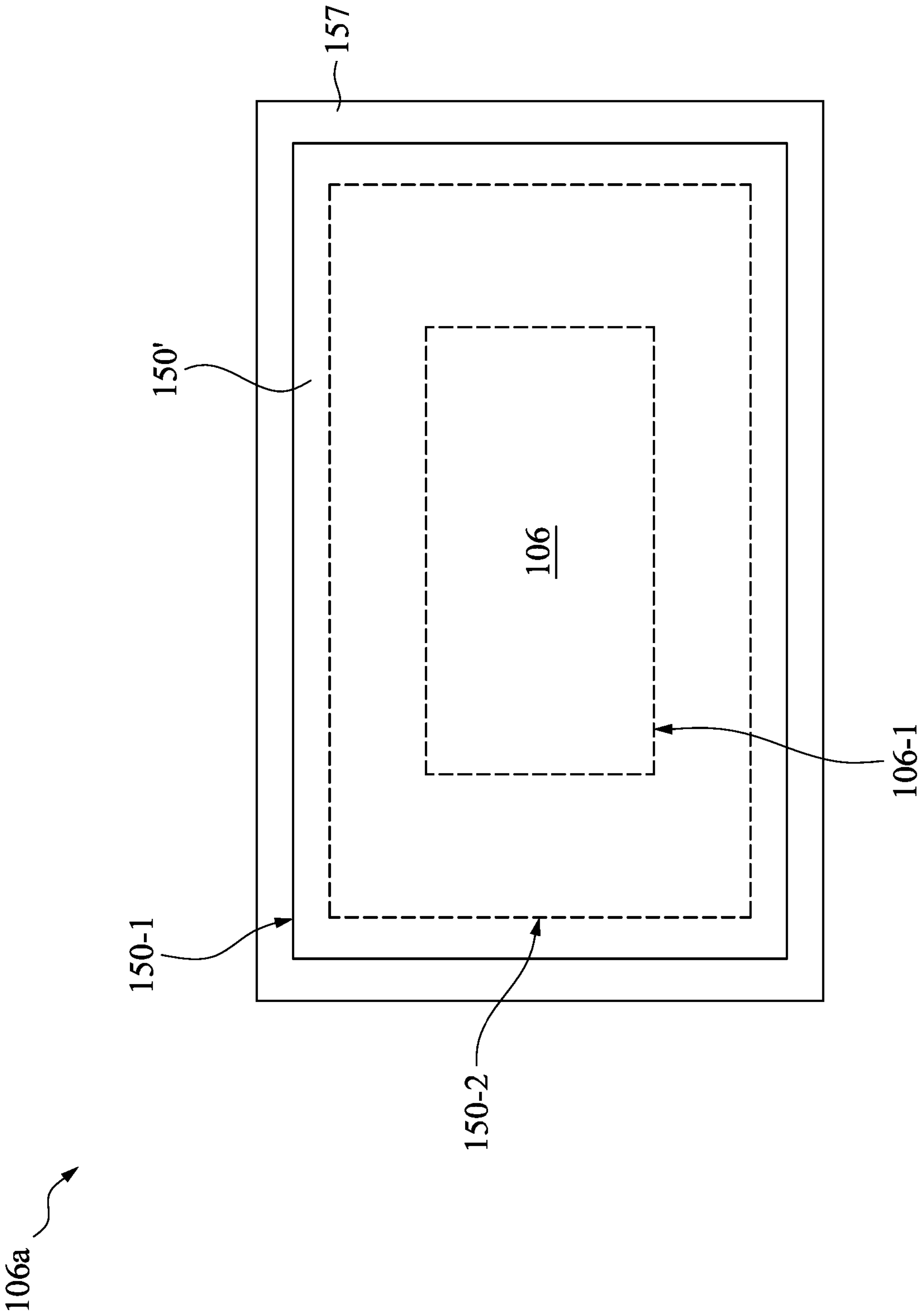

In FIG. 17, the mask layer 154 at the region 155 is removed and the semiconductor device structure 100 is subjected to a thermal treatment 158. The mask layer 154 may be removed using the ash process and/or any suitable etch process. The removal of the mask layer 154 exposes the surfaces of the capping layer 157 disposed over the first semiconductor layers 106, the well portion 116, and the insulating material 118 at the region 155. The openings 151 over the region 155 are revealed upon removal of the mask layer 154. The thermal treatment 158 causes the majority of the germanium in the cladding layer 150 to diffuse into and react with silicon of the first semiconductor layers 106 and a portion of the well portion 116, converting silicon in the first semiconductor layers 106 and the portion of the well portion 116 into an intermixed layer 106*a*, 116*a* containing silicon germanium. The intermixed layers 106*a*, 116*a* can be considered as modified first semiconductor layer 106/well portion 116. The term "intermixed layer" as used in this disclosure denotes a reaction product of the first semiconductor layers 106/well portion 116 and the cladding layer 150, which can be a compound, a composition or a mixture, depending on the thermal treatment used. In some embodiments, the intermixed layers 106*a*, 116*a* can be a first semiconductor layer 106 or well portion 116 doped with materials from the cladding layer 150 (e.g., germanium doped silicon). The cladding layer 150 can be considered as a modified cladding layer 150' due to the germanium concentration being less than that of the cladding layer 150 before the thermal treatment 158. In some embodiments, the entire first semiconductor layers 106 and the portion of the well portion 116 are converted into the intermixed layer 106*a*, 116*a*.

The thermal treatment 158 may be performed in-situ or ex-situ and can be any type of anneal, such as rapid thermal anneal or furnace anneal, etc. In some embodiments, the thermal treatment 158 is a furnace annealing process in which the semiconductor device structure 100 is thermally processed in a furnace at a temperature of about 850° C. to about 1200° C. for about 10 seconds to about 24 hours. In one embodiment, the thermal treatment 158 is performed for about 30 seconds at a temperature range of about 1000° C. The thermal treatment 158 may be performed in an atmosphere of gas, such as a nitrogen-containing, a hydrogen-containing gas, an oxygen-containing gas, an argon-containing gas, a helium-containing gas, or any combinations thereof. Exemplary gas may include, but are not limited to, $N_2$, $NH_3$, $O_2$, $N_2O$, Ar, He, $H_2$, etc.

The dopant atoms (e.g., germanium) from the cladding layer 150 (now modified cladding layer 150') are diffused into a portion of the well portion 116 to form the intermixed layer 116*a*. The thermal treatment 158 may be performed such that the dopant atoms are eventually distributed in the intermixed layers 116*a*. The capping layer 157 prevents the outgassing of the dopant atoms during the thermal treatment 158. The dopant atoms may extend a depth into the well portion 116. In some embodiments, the bottom of the intermixed layer 116*a* may be at an elevation that is level with or slightly below the top surface of the insulating material 118. Alternatively, the dopant atoms may be gradually distributed along the thickness of the intermixed layer 116*a*. In such cases, the dopant atoms at and/or near an interface of the modified cladding layer 150' and the capping layer 157 may have a first dopant concentration, and the dopant atoms at and/or near an interface of the modified cladding layer 150' and the well portion 116 may have a second dopant concentration that is greater than the first dopant concentration. The intermixed layer 116*a* may have a third dopant concentration that is greater than the second dopant concentration as a result of the thermal treatment 158.

Likewise, the dopant atoms (e.g., germanium) from the cladding layer 150 (now modified cladding layer 150') are distributed in the first semiconductor layer 106 in both lateral and vertical directions. In some embodiments, the intermixed layers 106*a* may have the dopant atoms evenly distributed throughout the thickness of the intermixed layer 106*a*. In some embodiments, the dopant atoms in the intermixed layers 106*a* may have a gradient profile. In such cases, the dopant concentration is radially and gradually changed along the thickness of the intermixed layers 106*a*. FIG. 17-1 illustrates an enlarged view of a portion of the intermixed layers 106*a* in accordance with some embodiments. In FIG. 17-1, the intermixed layer 106*a* may have a first dopant concentration at and/or near an interface 150-1 of the modified cladding layer 150' and the capping layer 157 and a second dopant concentration at and/or near an interface 150-2 of the modified cladding layer 150' and the first semiconductor layer 106. The thermal treatment 158 may be performed such that the dopant atoms (e.g., germanium) are gradually changed from the first dopant concentration to the second dopant concentration. In some embodiments, the first dopant concentration is greater than the second dopant concentration. In some embodiments, the second dopant concentration is greater than the first dopant concentration. In some embodiments, the core 106-1 of the first semiconductor layer 106 may have a third dopant concentration that is greater than the second dopant concentration. Alternatively, the third dopant concentration may be lesser than the second dopant concentration.

After the thermal treatment 158, the intermixed layers 106*a*, 116*a* have a dopant concentration less than the dopant concentration of the modified cladding layer 150'. In cases where the modified cladding layer 150' includes germanium, the intermixed layers 106*a*, 116*a* may have a Ge atomic percentage in a range of about 5 at. % to about 50 at. %. The formation of the intermixed layers 106*a* having germanium concentration of about 5 at. % or above (e.g., 10 at. % or above) can improve carrier (e.g., holes) mobility for the P-type FETs.

Figure 18:
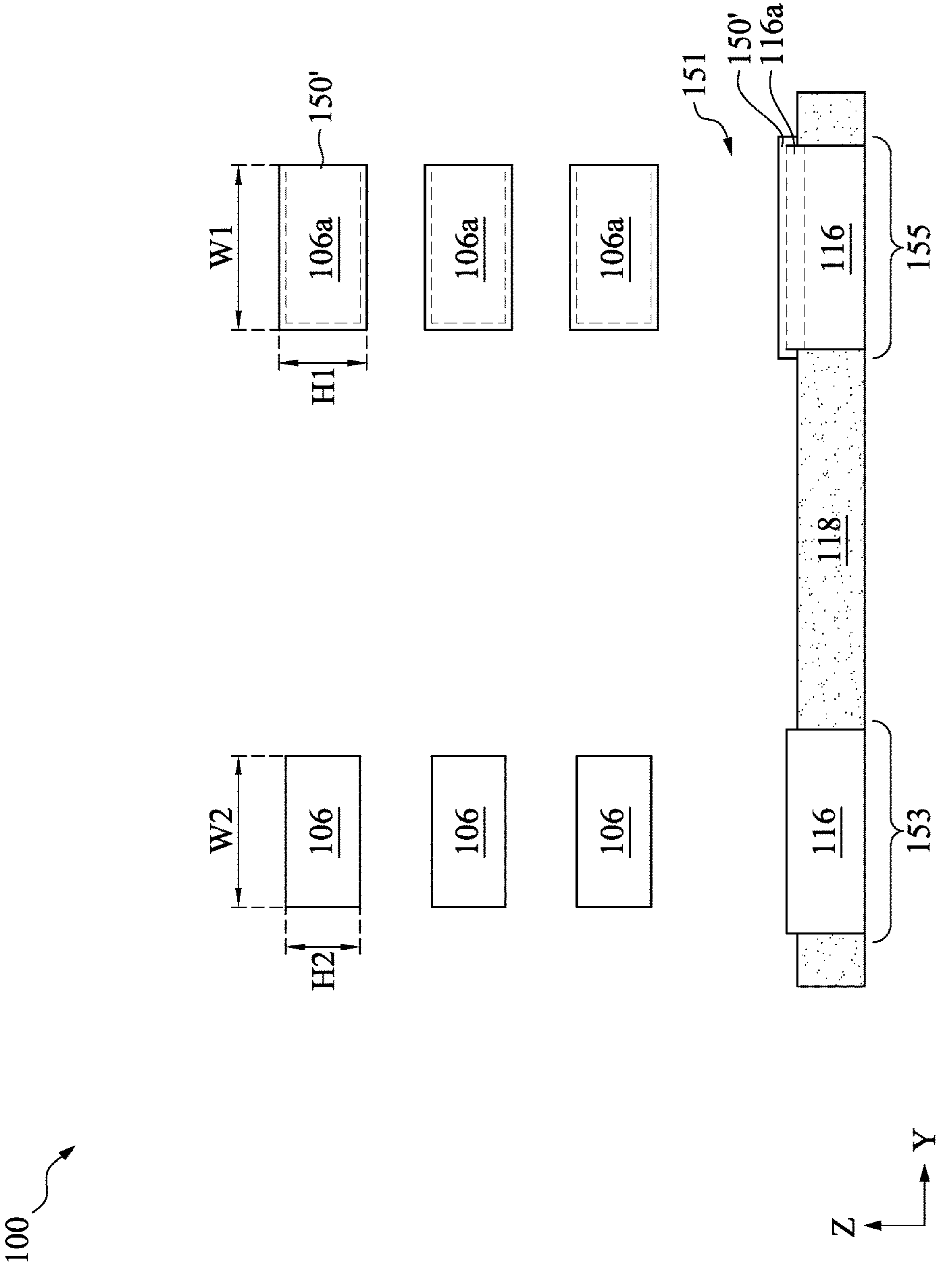

In FIG. 18, an etch process is performed to remove the capping layer 157 from over the intermixed layers 106*a*, 116*a*. The etch process may be a selective wet etching process that selectively removes the oxide materials (e.g., the capping layer 157) but does not remove the semiconductor materials (e.g., intermixed layers 106*a*, 116*a*, the first semiconductor layers 106, and the well portion 116). In one embodiment, the capping layer 157 disposed over the intermixed layers 106*a*, 116*a* is removed using a wet etchant such as, but not limited to, hydrofluoric (HF), nitric acid ($HNO_3$), hydrochloric acid (HCl), phosphoric acid ($H_3PO_4$), a dry etchant such as a fluorine-based gas (e.g., $F_2$) or a chlorine-based gas (e.g., $Cl_2$), or any suitable isotropic etchants. Upon removal of the capping layer 157, the modified cladding layer 150' over the intermixed layers 106*a*, 116*a* is exposed. The intermixed layers 106*a* and the modified cladding layer 150' at the region 155 may have a width W1 and a height H1, and the first semiconductor layer 106 at the region 153 may have a width W2 and a height H2 that are less than the width W1 and the height H1, respectively.

Figure 19:
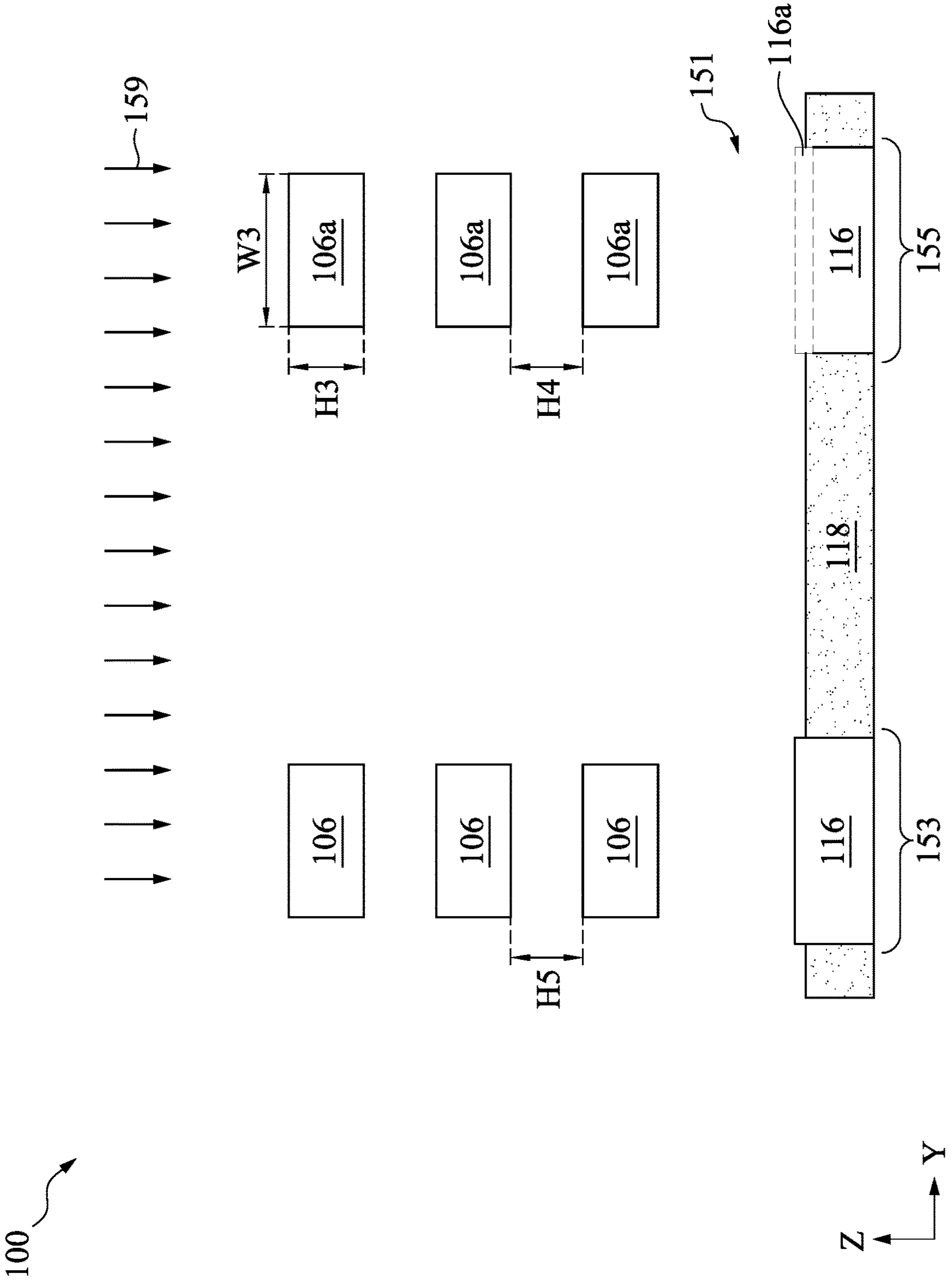

In FIG. 19, a trimming process 159 is performed to remove the modified cladding layer 150' disposed over the intermixed layers 106*a*, 116*a*. The trimming process 159 selectively removes the modified cladding layer 150' without substantially affecting the first semiconductor layers 106. The trimming process 159 may be a wet etch, a dry etch, or a combination thereof. The trimming process 159 may be an isotropic etching process. In some embodiments, the trimming process 159 is a wet etch process using at least ozone ($O_3$) and/or ammonium hydroxide ($NH_4OH$). For example, in one embodiment the wet etch process may include $NH_4OH$, HF or diluted HF, deionized (DI) water, tetramethylammonium hydroxide (TMAH), other suitable wet etching solution, or a combination thereof. In one embodiment the wet etch process may be a standard clean-2 (SC2) followed by a standard clean-1 (SC1), where the SC2 is a mixture of DI water, hydrochloric (HCl) acid, and hydrogen peroxide ($H_2O_2$), and the SC1 is a mixture of DI water, $NH_4OH$, and $H_2O_2$. In some embodiments, an isopropyl alcohol (IPA) may be used after the SC1. In some embodiments, the trimming process 159 is a dry etch process using HF and $F_2$ at a mixture ratio of about 1:4 of HF:$F_2$. In some embodiments, the trimming process 159 is a plasma etch process using a plasma formed from a gas mixture of oxygen ($O_2$), ozone ($O_3$), $NH_4OH$, steam ($H_2O$), tetrafluoromethane ($CF_4$), sulfur hexfluoride ($SF_6$), chlorine ($Cl_2$), $F_2$, HCl, or the like, or any combination thereof. The plasma etch process may be performed at a chamber pressure of about 5 mTorr to about 600 mTorr, at a RF power between about 20 W to about 200 W with a frequency between about 2 MHz and about 13.56 MHz. In some embodiments, the modified cladding layer 150' is removed using a reactive gas containing fluorine radicals. The trimming process 159 may be timed controlled for a duration of about 10 seconds to about 120 seconds.

In some embodiments, the trimming process 159 is a thermal atomic layer etching (ALE) process using $O_2$ or $O_3$, HF, and trimethylaluminum (TMA) as the reactants. The ALE process may be performed in a reactant sequence of $O_2$—HF-TMA at a temperature range of about 250° C. to about 350° C., a chamber pressure of about 0.1 Torr to about 1 Torr, and dose times of about 1-10 seconds, 1-20 seconds, and 1-20 seconds for $O_2$, HF, and TMA, respectively.

In some embodiments, the trimming process 159 may remove the modified cladding layer 150' entirely. In some embodiments, the removal of the modified cladding layer 150' may also remove a portion of the intermixed layers 106*a*, 116*a*. In some embodiments, a portion of the modified cladding layer 150' is converted into and becomes part of the intermixed layers 106*a*, 116*a*. In such cases, the trimming process 159 may remove the modified cladding layer 150' and portions of the intermixed layers 106*a*, 116*a* that were converted from the modified cladding layer 150'. After the trimming process 159, the intermixed layers 106*a* at the region 155 may have a width W3 and a height H3 that are less than the width W1 and the height H1, respectively. However, the width W3 and the height H3 of the intermixed layers 106*a* are greater than the width W2 and the height H2 of the first semiconductor layers 106 at the region 153. In some embodiments, the width W3 and the height H3 are about 0.5 nm greater than the width W2 and the height H2.

In some embodiments, the trimming process 159 is performed so that the spacing between the adjacent intermixed layers 106*a* has a height H4, and the spacing between the adjacent first semiconductor layers 106 has a height H5 that is less than the height H4. In some embodiments, the trimming process 159 is performed so that the height H5 is greater than the height H4. In some embodiments, the trimming process 159 is performed so that the height H5 is substantially the same as the height H4. The height H4 may vary depending on the duration of the trimming process 159. In various embodiments, the heights H4 and H5 may be in a range of about 4 nm to about 15 nm, such as about 5 nm to about 10 nm. The heights H4 and H5 may be selected depending on, for example, the threshold voltage needed for the devices in the regions 153, 155.

Figure 20:
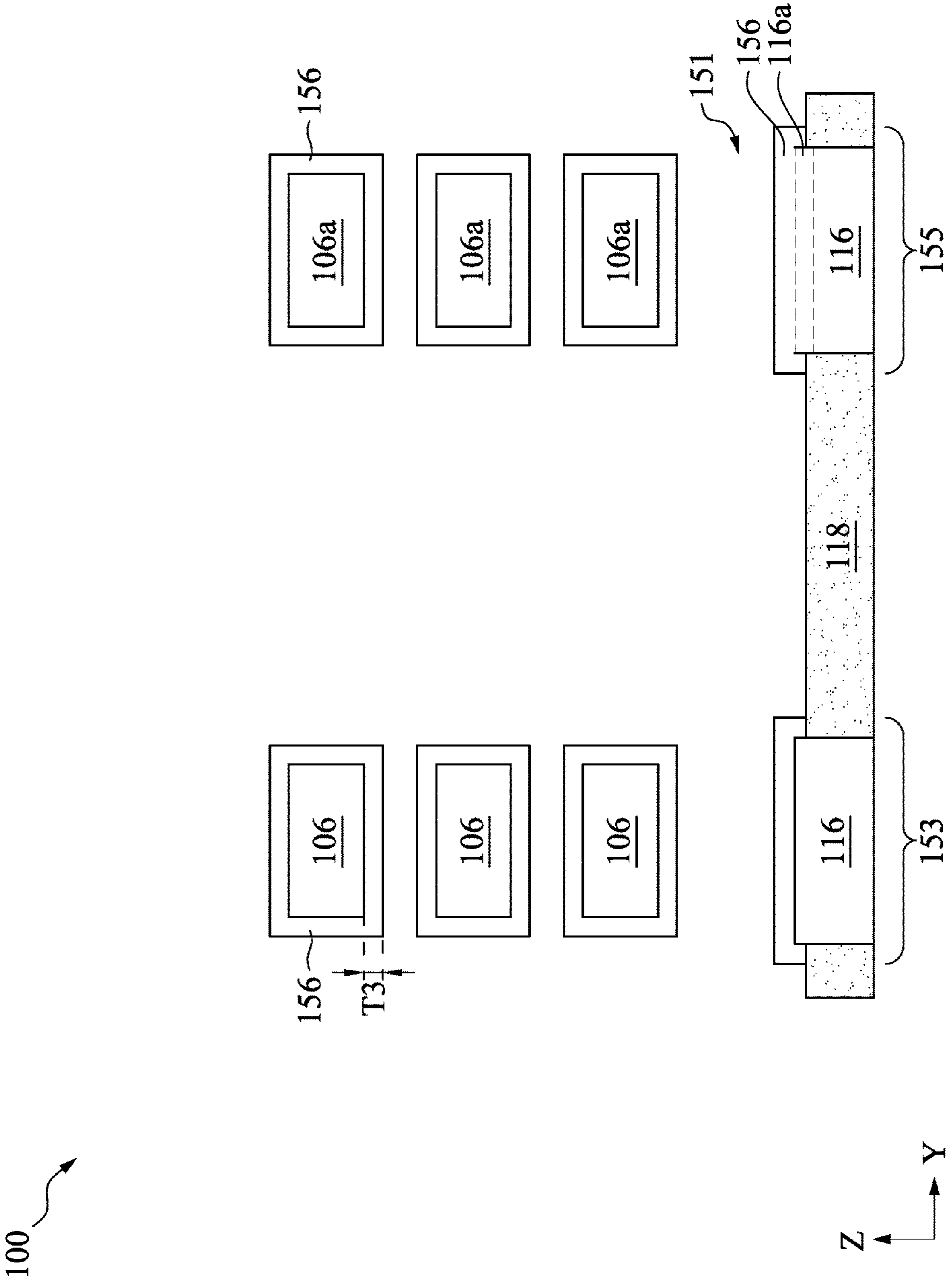

In FIG. 20, an interfacial layer (IL) 156 is formed on exposed surfaces of the first semiconductor layers 106 at the region 153 and the intermixed layers 106*a* at the region 155. The IL 156 may also form on the well portion 116 at the region 153 and the intermixed layer 116*a* over the well portion 116 at the region 155. The IL 156 may include or be made of an oxygen-containing material, such as silicon oxide, silicon oxynitride, oxynitride, etc. In one embodiment, the IL 156 is silicon oxide. The IL 156 may be formed by subjecting the first semiconductor layers 106, the intermixed layers 106*a*, 116*a*, and the well portion 116 to a pre-clean process. The pre-clean process may be any suitable wet cleaning process such as an APM process, which includes at least water ($H_2O$), $NH_4OH$, and $H_2O_2$, a HPM process, which includes at least $H_2O$, $H_2O_2$, and HCl, a SPM process (also known as piranha clean), which includes at least $H_2O_2$ and sulfuric acid ($H_2SO_4$), or any combination thereof. Alternatively or additionally, the IL 156 may be formed by oxidizing an outer portion of the first semiconductor layers 106, the well portion 116, and the intermixed layers 106*a*, 116*a*. In such cases, the IL 156 may be formed using an oxidation process such as thermal oxidation process, a rapid thermal oxidation (RTO) process, an in-situ stream generation (ISSG) process, or an enhanced in-situ stream generation (EISSG) process. In some embodiments, the IL 156 may be formed by CVD, ALD or any suitable conformal deposition technique. In some embodiments, the IL 156 may have a thickness T3 in a range of about 0.3 nm to about 1.5 nm.

Figure 21:
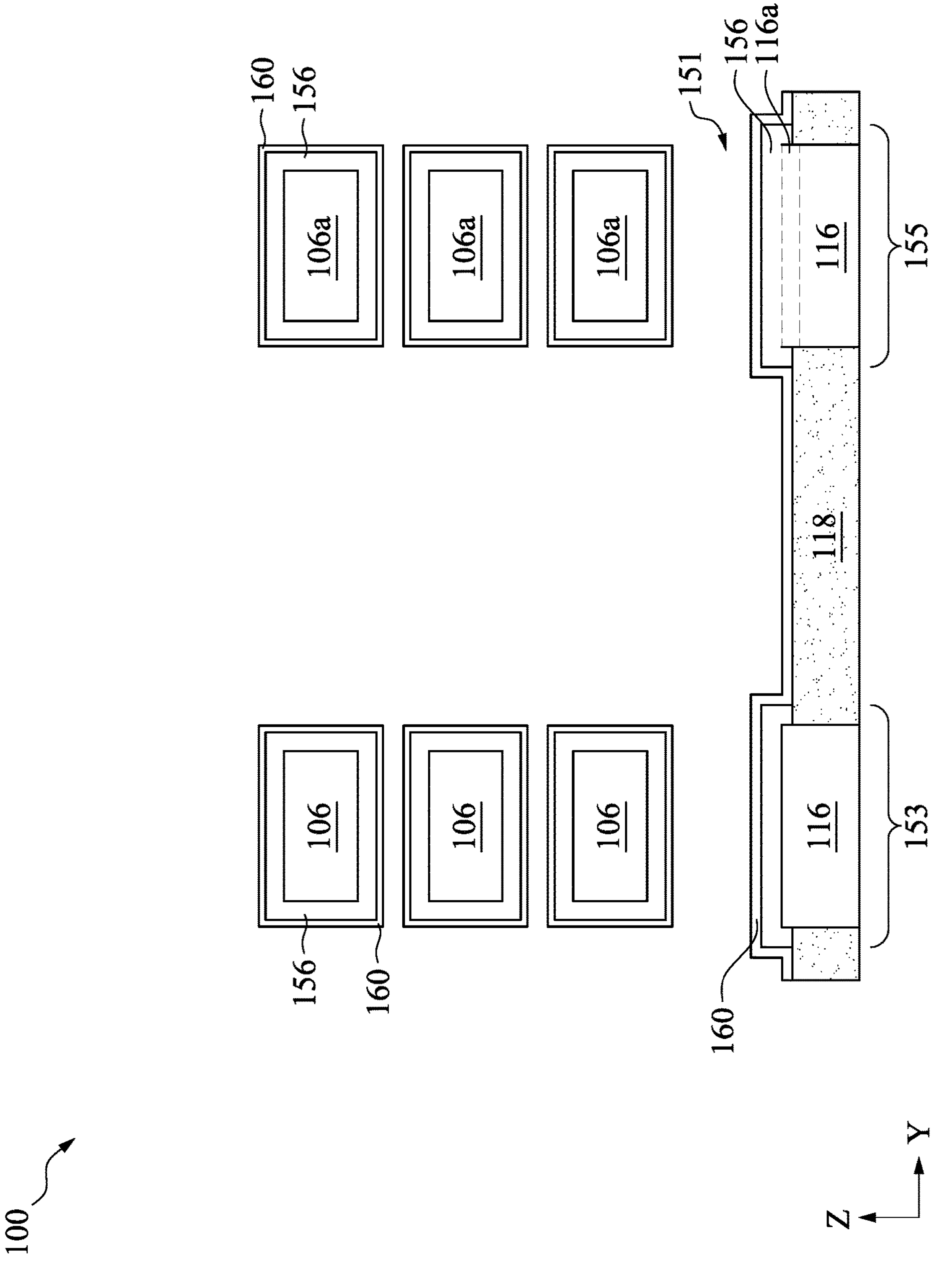

In FIG. 21, a high-K (HK) dielectric layer 160 is formed on the exposed surfaces of the semiconductor device structure 100. In some embodiments, the HK dielectric layer 160 is formed to wrap around and in contact with the IL 156 over the first semiconductor layers 106 and the intermixed layers 106*a* at regions 153, 155. The HK dielectric layer 160 is also formed on the exposed surface of the insulating material 118. The HK dielectric layer 160 may include or made of hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. The HK dielectric layer 160 may be a conformal layer formed by a conformal process, such as an ALD process or a CVD process. The HK dielectric layer 160 may have a thickness ranging from about 0.5 nm to about 3 nm.

Figure 22:
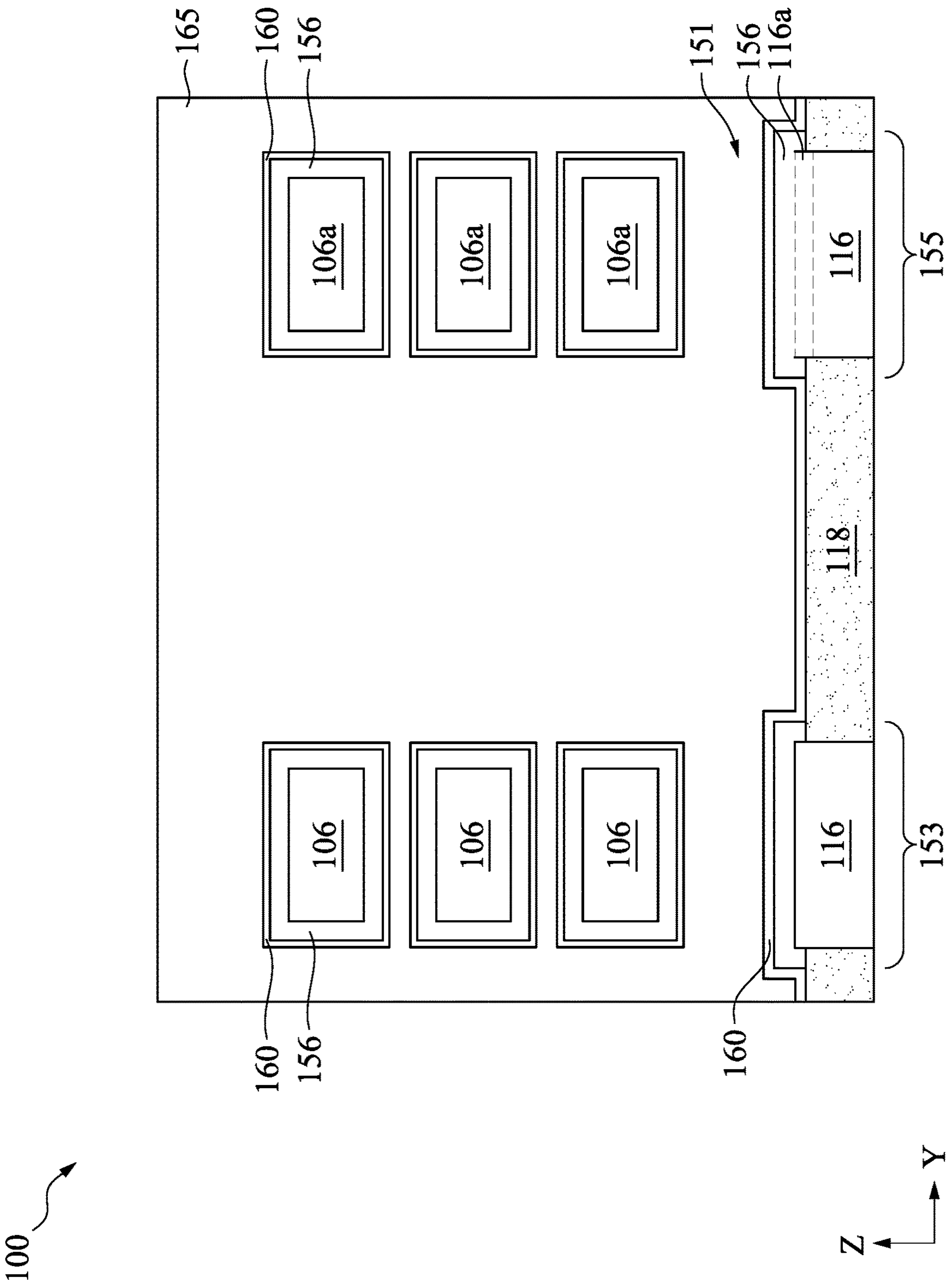

In FIG. 22, a first gate electrode layer 165 is formed on the HK dielectric layer 160. The first gate electrode layer 165 filles the opening 151 (FIG. 21) and surrounds a portion of each first semiconductor layer 106 and the intermixed layers 106*a* at the region 153, 155. The first gate electrode layer 165 may be deposited so that at least the nanosheet transistors at the regions 153, 155 are submerged in the first gate electrode layer 165. In some embodiments, the first gate electrode layer 165 is deposited to a height over a top surface of the HK dielectric layer 160 over the first semiconductor layer 106 and the intermixed layers 106*a*. In some embodiments, the first gate electrode layer 165 may be formed using multiple layers, each layer deposited sequentially adjacent to each other using a highly conformal deposition process such as ALD. Other deposition technique such as PVD, CVD, or electro-plating may also be used. While not shown, the first gate electrode layer 165 may include a capping layer, a barrier layer, an n-metal work function layer, a p-metal work function layer, and a fill material. The capping layer and the barrier layer may be metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be formed of a material different from the capping layer. The n-metal work function layer may be formed from a metallic material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable n-type work function materials, or combinations thereof. The p-metal work function layer may be formed from a metallic material such as W, Al, Cu, TiN, Ti, TiAlN, Ta, Co, Ni, TaC, TaCN, TaSiN, $TaSi_2$, $NSi_2$, Mn, Zr, $ZrSi_2$, TaN, Ru, AlCu, Mo. $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Once the n-metal work function layer and the p-metal work function layer are formed, the fill material is deposited to fill a remainder of the opening 151. The fill material may be a material such as W, Al, Cu, AlCu, W, Ti, TiAlN, TC, TaCN, TaSiN, Mn, Zr, TiN, Ta, TaN, Co, Ni, combinations of these, or the like.

Figure 23:
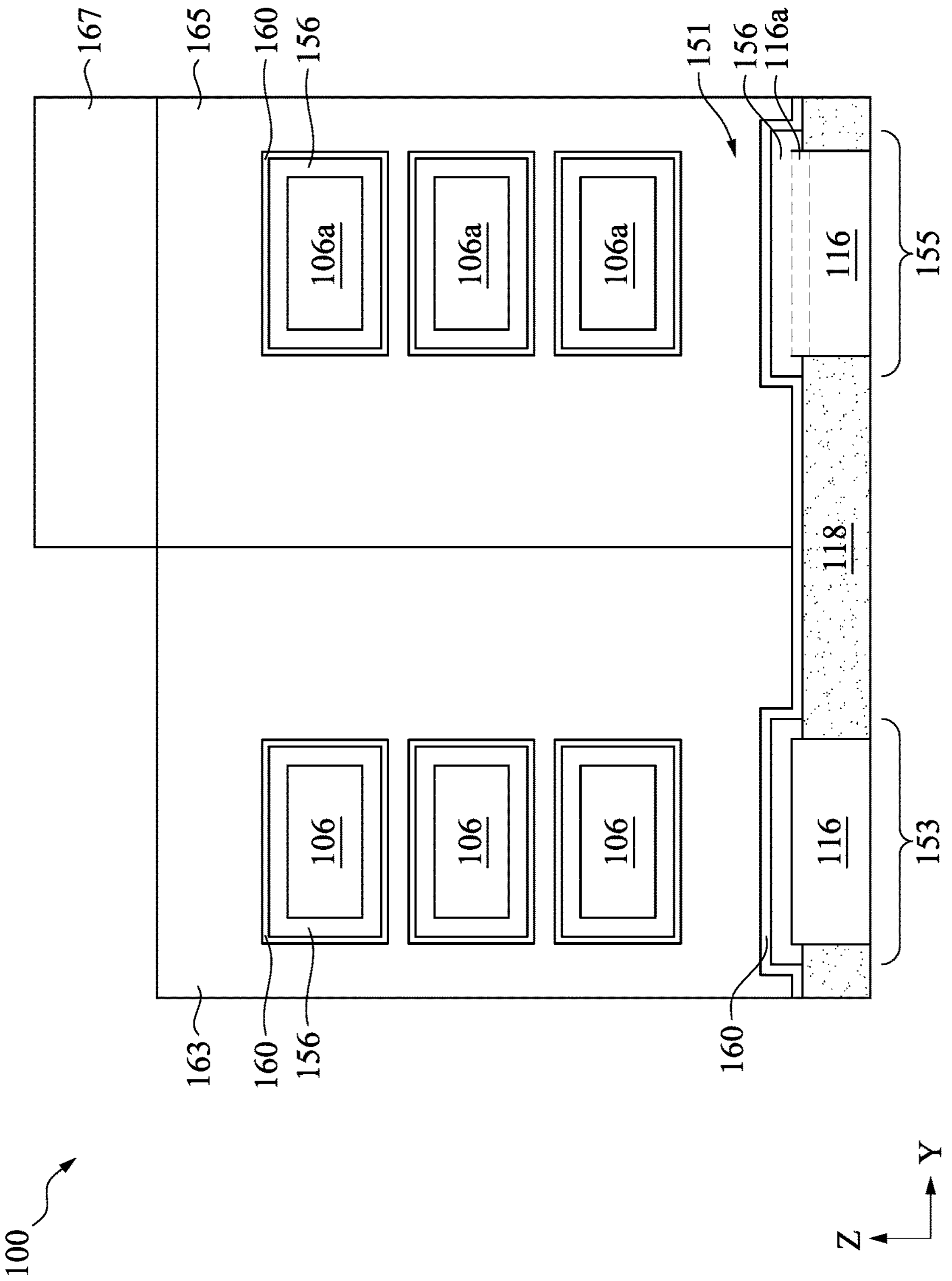
Figure 24C:
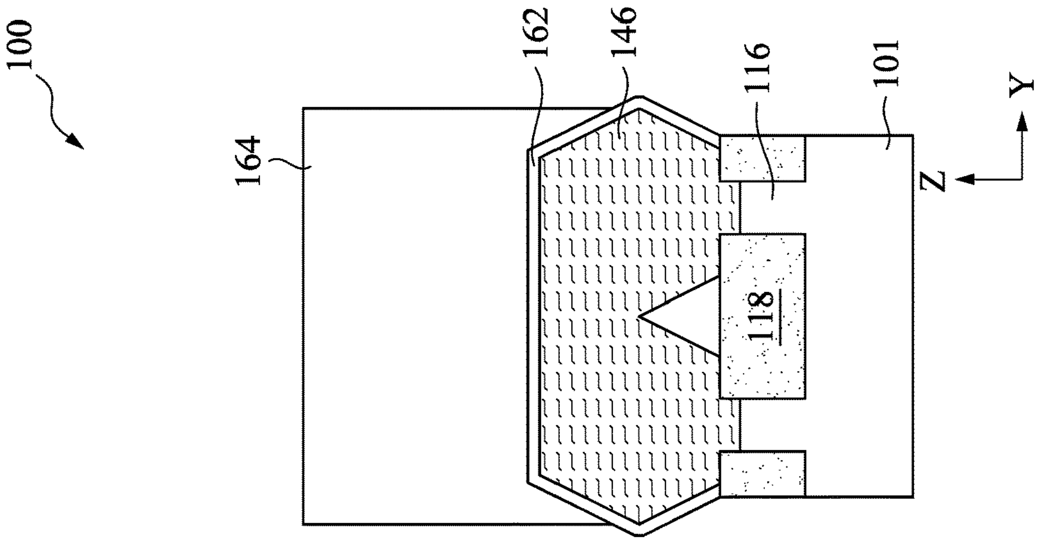
FIGS. 24A-24D and 25A-25D are perspective views of one of the various stages of manufacturing the semiconductor device structure taken along cross-sections A-A, B-B, C-C, and D-D of FIG. 6, in accordance with some embodiments.
Figure 24B:
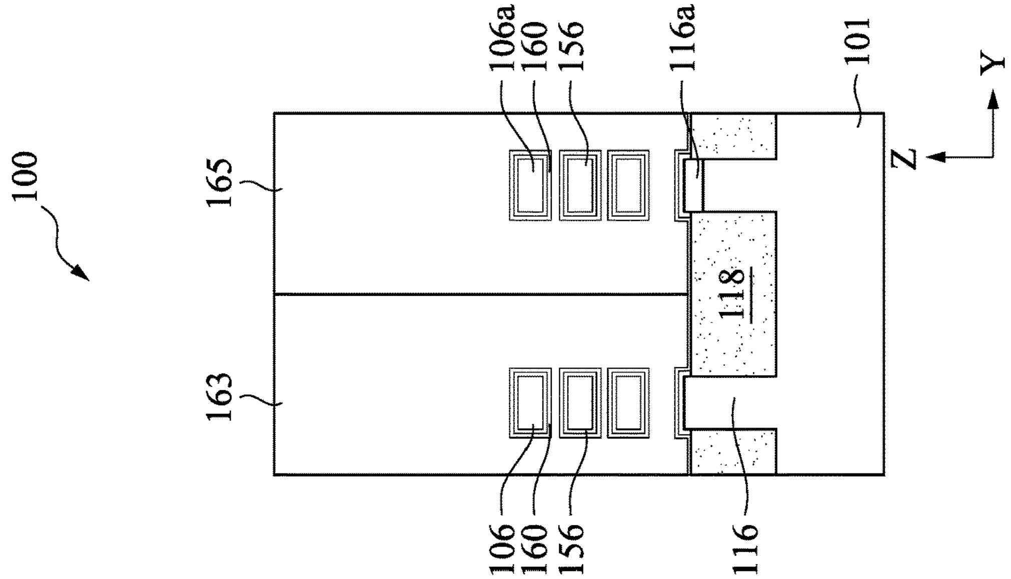
Figure 24A:
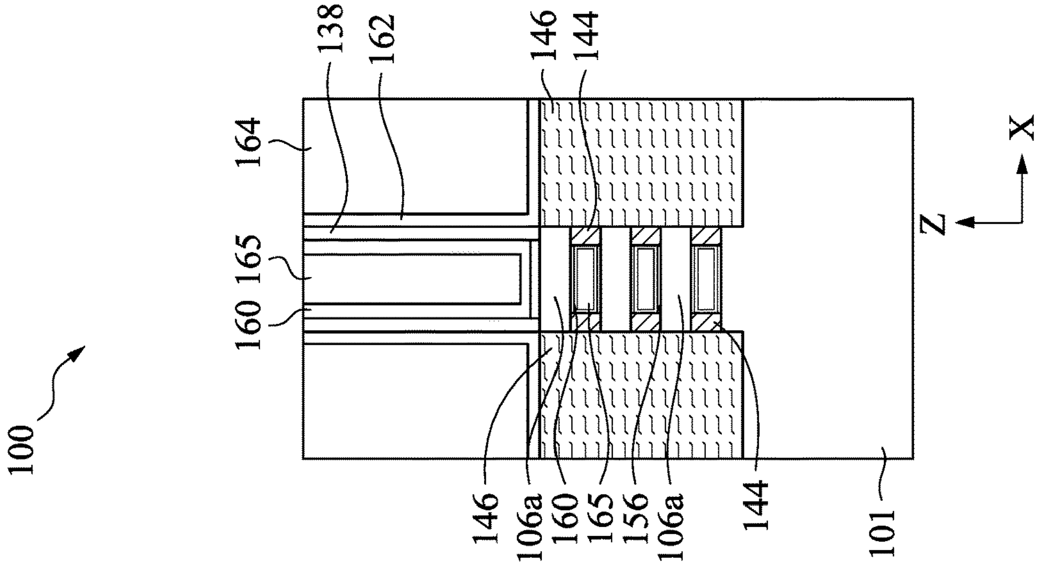
Figure 24D:
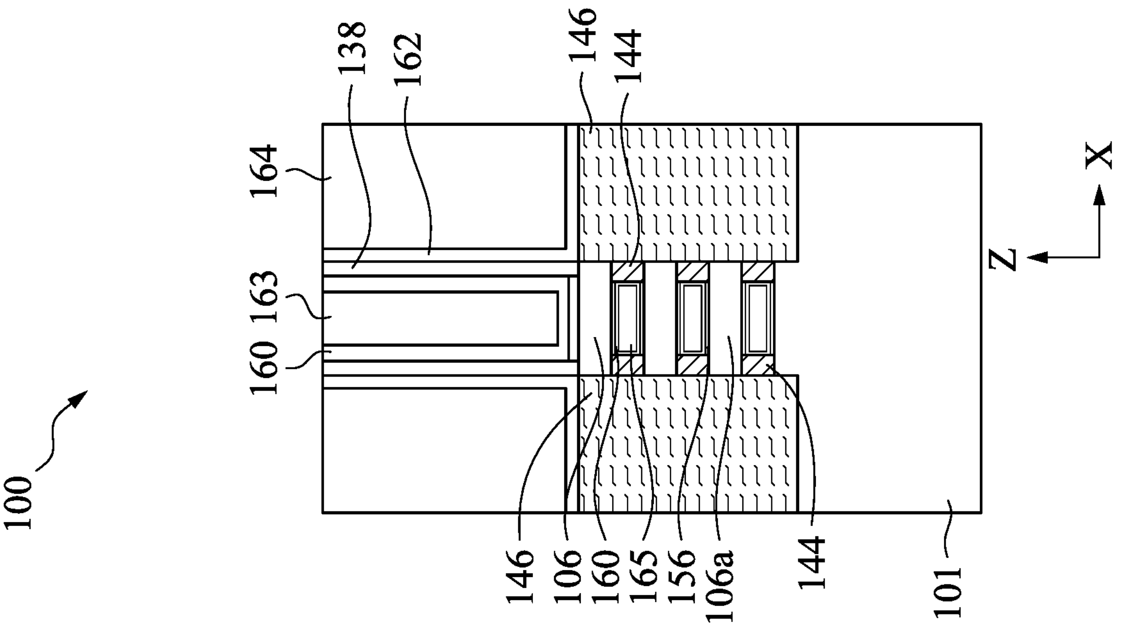
Figures 25A, 25B, 25C:
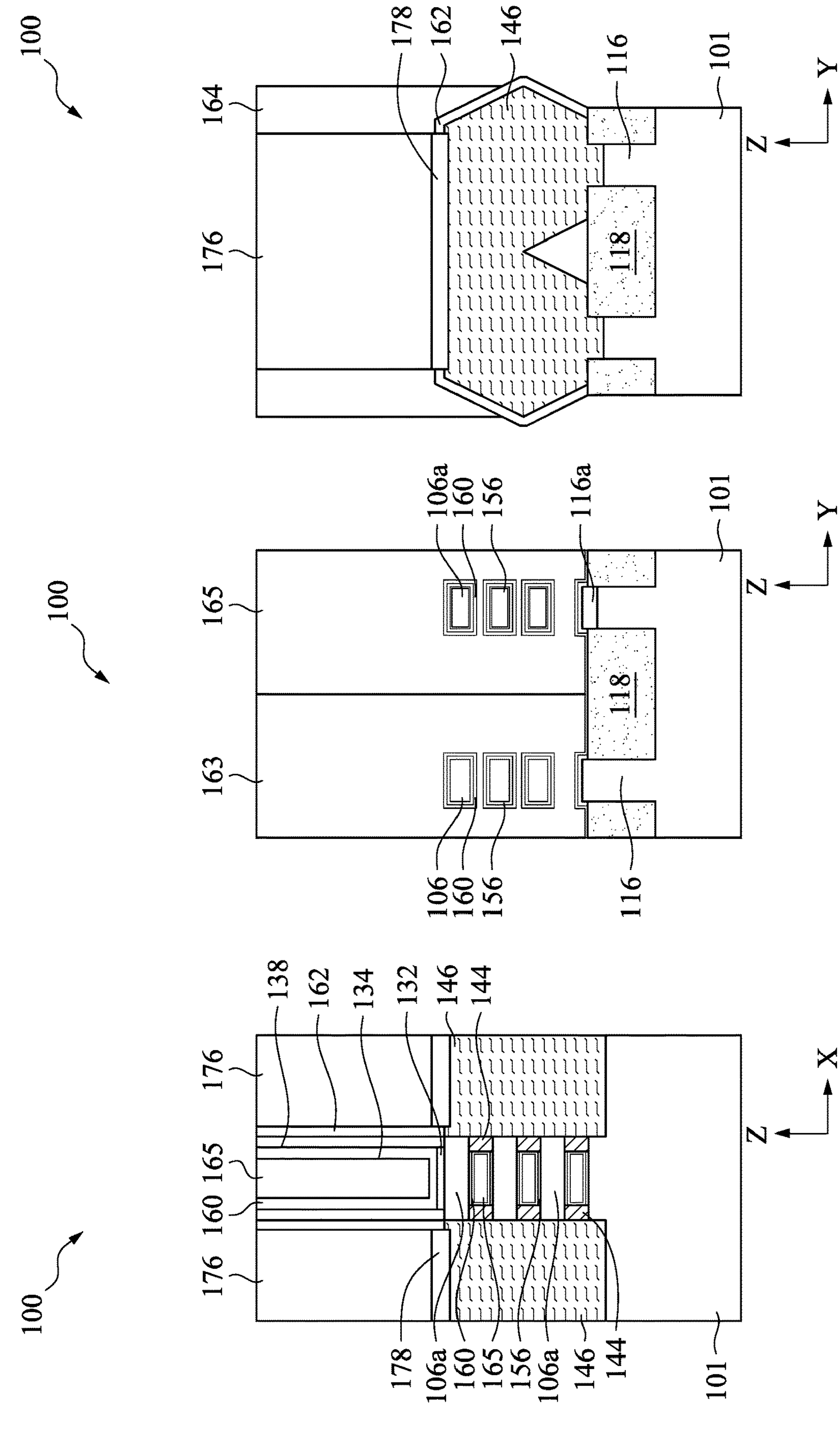
Figure 25D:
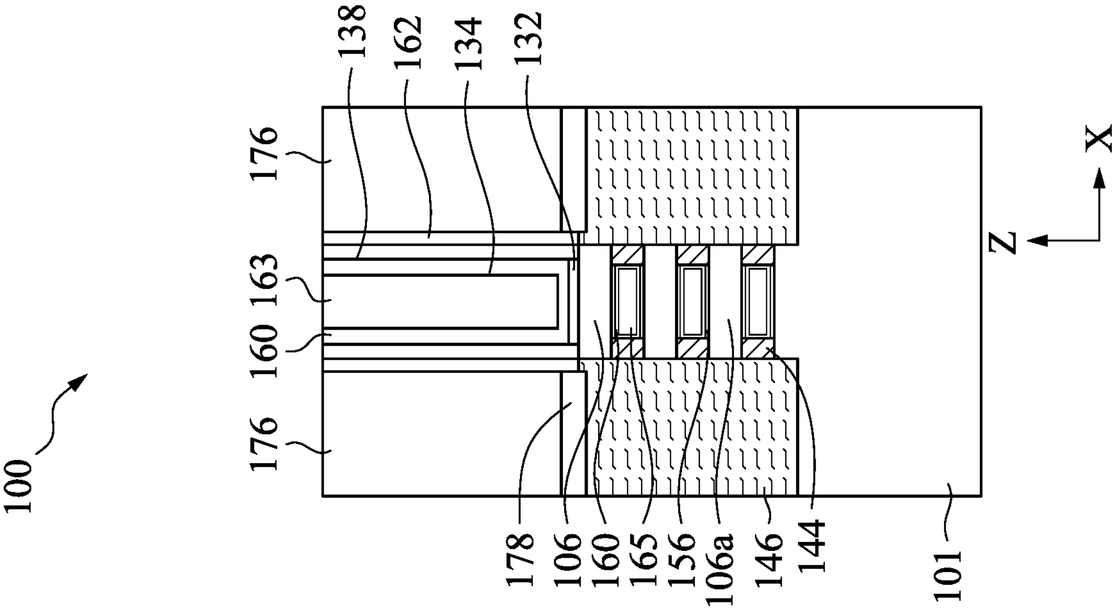

In FIG. 23, portions of the first gate electrode layer 165 at the region 153 are removed and a second gate electrode layer 163 is formed in the region where the first gate electrode layer 165 was removed. A patterned resist layer 167 may be first formed to cover P-type FETs, such as nanosheet transistors at the region 155, while the N-type FETs, such as nanosheet transistors at the region 153 are left uncovered. The patterned resist layer 167 protects the first gate electrode layer 165 and the nanosheet transistors at the region 155 so that the first gate electrode layer 165 over the nanosheet transistors at the region 153 are removed. The patterned resist layer 167 may be formed by first forming a blanket layer on the semiconductor device structure 100, followed by patterning and etching processes to remove portions of the blanket layer at selected regions to form the patterned resist layer 167. The patterned resist layer 167 may use the same material as the mask layer 154 (FIG. 16). Once the patterned resist layer 167 is formed, the first gate electrode layer 165 over the nanosheet transistors at the region 153 and not covered by the patterned resist layer 167 are removed. The first gate electrode layer 165 may be removed using any suitable processes, such as dry etch, wet etch, or a combination thereof. The removal process may be a selective etch process that removes the first gate electrode layer 165 but not the HK dielectric layer 160.

Next, the second gate electrode layer 163 is formed on the HK dielectric layer 160 and in the region where the first gate electrode layer 165 was removed. The second gate electrode layer 163 may be deposited so that at least the nanosheet transistors at the regions 153 are submerged in the second gate electrode layer 163. The second gate electrode layer 163 surrounds a portion of each first semiconductor layer 106 at the region 153. In some embodiments, the second gate electrode layer 163 is deposited to a height over the top surface of the HK dielectric layer 160 over the first semiconductor layer 106. Likewise, the second gate electrode layer 163 may be formed using multiple layers, each layer deposited sequentially adjacent to each other using a highly conformal deposition process such as ALD. The second gate electrode layer 163 may also include a capping layer, a barrier layer, an n-metal work function layer, a p-metal work function layer, and a fill material, such as those used for the first gate electrode layer 165. In some embodiments, the second gate electrode layer 163 is chemically different than the first gate electrode layer 165. Each layer in the first and second gate electrode layers 165, 163 may be chosen depending on the threshold volage and application of the NMOS or PMOS devices needed for regions 153, 155.

FIGS. 24A-24D and 25A-25D are perspective views of one of the various stages of manufacturing the semiconductor device structure 100 taken along cross-sections A-A, B-B, C-C, and D-D of FIG. 6, in accordance with some embodiments. Cross-section D-D is perpendicular to cross-section C-C and is in a plane of the fin structure 112 along the X direction. Specifically, FIGS. 24A-24D illustrates the stage after the second gate electrode layer 163 is formed at the regions 153 and the patterned resist layer 167 is removed.

In FIGS. 25A-25D, contact openings are formed through the ILD layer 164 and the CESL 162 (FIGS. 26A and 26D) to expose the epitaxial S/D feature 146. A silicide layer 178 is then formed on the epitaxial S/D features 146 to conductively couple the epitaxial S/D features 146 to the subsequently formed S/D contacts 176. The silicide layer 178 may be formed by depositing a metal source layer over the epitaxial S/D features 146 and performing a rapid thermal annealing process. The metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. During the rapid anneal process, the portion of the metal source layer over the epitaxial S/D features 146 reacts with silicon in the epitaxial S/D features 146 to form the silicide layer 178. Unreacted portion of the metal source layer is then removed.

After formation of the silicide layer 178, a conductive material is formed in the contact openings and form the S/D contacts 176. The conductive material may be made of a material including one or more of Ru, Mo, Co, Ni. W, Ti, Ta, Cu, Al, TiN and TaN. While not shown, a barrier layer (e.g., TiN, TaN, or the like) may be formed on sidewalls of the contact openings prior to forming the S/D contacts 176. Then, a planarization process, such as CMP, is performed to remove excess deposition of the contact material and expose the top surface of the second gate electrode layer 179.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 by flipping over the semiconductor device structure 100, removing the substrate 101, and selectively connecting source or drain feature/terminal of the epitaxial S/D features 146 to a backside power rail (e.g., positive voltage VDD or negative voltage VSS) through the backside contacts. Depending on the application, the source or drain feature/terminal of the epitaxial S/D features 146 and the gate electrode layer 172 may be connected to a frontside power source.

Embodiments of the present disclosure provide methods to improve carrier mobility for gate all around (GAA) transistors by surrounding PMOS silicon channel layers with a germanium cladding layer, and heating the germanium cladding layer so that germanium atoms are diffused into and reacted with silicon in the PMOS channel layers to form PMOS silicon germanium channel layers. In some embodiments, an oxide capping layer is formed on the germanium cladding layer to prevent outgassing of germanium atoms. The oxide capping layer and the germanium cladding layer are then removed. Compared to conventional GAA transistors having a silicon germanium layer stacked on the silicon channel layers, the inventive approach enhances germanium concentration in PMOS silicon germanium channel layers through thermally drive-in process, which improves carrier mobility for PMOS channel layers with (100) silicon surfaces without interface scattering that would otherwise occur between silicon germanium cladding layer and the silicon channel layer if they were presented as a multi-layered structure. As a result, the same sheet-to-sheet spacing between PMOS channel layers is maintained, and an improved short channel control with high mobility and GAA characteristics is achieved. In addition, valence band shift and flat band voltage (Vfb) shift of silicon germanium alloy on top of silicon is reduced, which are beneficial for supply voltage (Vdd) applications.

A method for forming a semiconductor device structure is provided. The method includes forming a fin structure having first semiconductor layers and second semiconductor layers alternatingly stacked thereover, forming a sacrificial gate structure over a portion of the fin structure, removing portions of the sacrificial gate structure to expose the first and second semiconductor layers, removing portions of the second semiconductor layers to expose portions of each of the first semiconductor layers. The method also includes surrounding the exposed portions of each of the first semiconductor layers with a cladding layer, wherein the cladding layer is formed of a material chemically different from the first semiconductor layers, and the cladding layer has a first atomic percentage of germanium. The method also includes performing a thermal treatment so that germanium atoms of the cladding layer are diffused into and reacted with the first semiconductor layer to form an intermixed layer, wherein the intermixed layer has a second atomic percentage of germanium that is less than the first atomic percentage of germanium. The method further includes forming a gate electrode layer to surround each of the intermixed layers.

Another embodiment is a method for forming a semiconductor device structure. The method includes providing a first fin structure and a second fin structure, each first and second fin structure comprises a plurality of first semiconductor layers and a plurality of second semiconductor layers alternatingly stacked, forming a sacrificial gate structure over the first and second fin structures, removing portions of the sacrificial gate structure to expose the first and second semiconductor layers, removing portions of the plurality of second semiconductor layers to expose portions of each of the plurality of first semiconductor layers of the first and second fin structures, forming a cladding layer on the exposed portions of each of the plurality of first semiconductor layers of the first fin structures, the cladding layer comprising germanium. The method also includes performing a thermal treatment on the cladding layer so that germanium atoms diffuse into and convert each of the plurality of first semiconductor layers of the first fin structure into a third semiconductor layer that is chemically different from the first and second semiconductor layers, subjecting each of the plurality of third semiconductor layers and each of the plurality of first semiconductor layers to a trimming process so that the third semiconductor layer has a first width and the first semiconductor layer has a second width less than the first width, and forming a first gate electrode layer to surround each of the plurality of first and third semiconductor layers.

A further embodiment is a method for forming a semiconductor device structure. The method includes providing a first fin structure and a second fin structure at a first device region and a second device region, respectively, each first and second fin structure comprises a plurality of first semiconductor layers and a plurality of second semiconductor layers alternatingly stacked, forming a sacrificial gate structure over the first and second fin structures, forming a source/drain feature on opposite sides of the sacrificial gate structure, the source/drain feature being in contact with the plurality of first semiconductor layers of the first and second fin structures, removing portions of the sacrificial gate structure and the plurality of second semiconductor layers to expose portions of each of the plurality of first semiconductor layers of the first and second fin structures, surrounding the exposed portions of each of the plurality of first semiconductor layers of the first and second fin structures with a cladding layer comprising silicon germanium, selectively removing the cladding layer from each of the plurality of first semiconductor layers of the second fin structure to expose the portions of each of the plurality of first semiconductor layers at the second device region, subjecting the exposed portions of each of the plurality of first semiconductor layers at the second device region and the cladding layer at the first device region to a thermal treatment so that each of the plurality of first semiconductor layers at the first device region is chemically modified to include silicon germanium, and forming a gate electrode layer to surround each of the plurality of first semiconductor layers at the first and second device regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:

forming a fin structure having first semiconductor layers and second semiconductor layers alternatingly stacked thereover;

forming a sacrificial gate structure over a portion of the fin structure;

removing portions of the sacrificial gate structure to expose the first and second semiconductor layers;

removing portions of the second semiconductor layers to expose portions of each of the first semiconductor layers;

surrounding the exposed portions of each of the first semiconductor layers with a cladding layer, wherein the cladding layer is formed of a material chemically different from the first semiconductor layers, and the cladding layer has a first atomic percentage of germanium;

forming a capping layer on the cladding layer, wherein a first concentration of the germanium atoms at and/or near an interface between the capping layer and the cladding layer is less than a second concentration of the germanium atoms at and/or near an interface between the cladding layer and the first semiconductor layers;

performing a thermal treatment so that germanium atoms of the cladding layer are diffused into and reacted with the first semiconductor layers to form an intermixed layer, wherein the intermixed layer has a second atomic percentage of germanium that is less than the first atomic percentage of germanium;

forming a thinned intermixed layer by partially removing material of the intermixed layer; and forming a gate electrode layer to surround the thinned intermixed layer.

2. The method of claim 1, wherein the first semiconductor layers comprise silicon and the cladding layer comprises silicon germanium.

3. The method of claim 1, wherein the first atomic percentage of germanium is in a range of about 20 at. % to about 100 at. %, and second atomic percentage of germanium is in a range of about 5 at. % to about 50 at. %.

4. The method of claim 3, wherein the cladding layer is a pure germanium layer.

5. The method of claim 3, wherein the germanium atoms are evenly distributed throughout the intermixed layer.

6. The method of claim 1, wherein forming the capping layer comprises forming the capping layer comprising hafnium oxide or aluminum oxide.

7. The method of claim 1, wherein the cladding layer has a first thickness and the first semiconductor layer has a second thickness, and a ratio of the first thickness to the second thickness is in a range of about 1:5 to about 1:30.

8. The method of claim 1, wherein forming the capping layer comprises:

prior to the thermal treatment, forming the capping layer on the cladding layer.

9. The method of claim 1, wherein the capping layer comprises an oxide.

10. The method of claim 1, further comprising:

prior to forming the thinned intermixed layer, removing the capping layer.

11. A method for forming a semiconductor device structure, comprising:

forming a stack comprising alternating first semiconductor layers and second semiconductor layers, the stack overlying a well portion extending above an isolation region;

removing portions of the second semiconductor layers to expose portions of each of the first semiconductor layers and a portion of the well portion;

forming a cladding layer on the exposed portions of the first semiconductor layers and the well portion, the cladding layer including a material chemically different from the first semiconductor layers and the well portion;

forming an intermixed layer by increasing an atomic percentage of the material in the exposed portions of the first semiconductor layers via the cladding layer, the intermixed layer having a second atomic percentage of the material that is less than a first atomic percentage of the material of the cladding layer;

forming a second intermixed layer by increasing an atomic percentage of the material in the exposed portions of the well portion via the cladding layer, the second intermixed layer extending to a level below a top surface of the isolation region; and forming a gate electrode layer on the intermixed layers.

12. The method of claim 11, further comprising:

prior to forming the intermixed layer, forming a capping layer on the cladding layer.

13. The method of claim 12, wherein a first concentration of the material at and/or near an interface between the capping layer and the cladding layer is less than a second concentration of the material at and/or near an interface between the cladding layer and the first semiconductor layers.

14. The method of claim 12, further comprising:

forming a second stack comprising alternating first semiconductor layers and second semiconductor layers; and prior to forming the intermixed layer, removing the capping layer and the cladding layer from the second stack.

15. The method of claim 11, wherein forming the intermixed layer comprises performing a thermal treatment that is performed in a furnace at a temperature of about 850° C. to about 1200° C. for about 10 seconds to about 24 hours.

16. A method for forming a semiconductor device structure, comprising:

forming a first stack and a second stack, each comprising alternating first semiconductor layers and second semiconductor layers;

forming a sacrificial gate structure over respective portions of the first stack and the second stack;

removing portions of the second semiconductor layers to expose portions of each of the first semiconductor layers;

forming a cladding layer that surrounds the exposed portions of each of the first semiconductor layers, the cladding layer comprising a material having a first atomic percentage of germanium different than a second atomic percentage of germanium of the first semiconductor layers;

forming a capping layer on the cladding layer, a first concentration of the germanium of the cladding layer adjacent a first interface between the capping layer and the cladding layer being less than a second concentration of the germanium adjacent a second interface between the cladding layer and the first semiconductor layer;

diffusing germanium atoms of the cladding layer into the first semiconductor layers yielding intermixed layers, the intermixed layers comprising a second atomic percentage of germanium that is less than the first atomic percentage of germanium; and forming a gate electrode layer that surrounds each of the intermixed layers.

17. The method of claim 16, wherein forming the capping layer includes forming the capping layer including hafnium oxide or aluminum oxide.

18. The method of claim 17, further comprising:

prior to diffusing the germanium atoms, removing the capping layer and the cladding layer from on the second stack.

19. The method of claim 16, wherein the first atomic percentage of germanium is in a range of about 20 at. % to about 100 at. %, and second atomic percentage of germanium is in a range of about 5 at. % to about 50 at. %.

20. The method of claim 16, further comprising performing a trimming process to remove a portion of the intermixed layer prior to forming the gate electrode layer.

* * * * *